US012785049B2

(12) United States Patent
Yu et al.

(10) Patent No.: US 12,785,049 B2
(45) Date of Patent: Nov. 3, 2026

(54) FOCUS RING AND METHOD FOR MANUFACTURING THE SAME

(71) Applicant: HANA MATERIALS INC., Cheonan-si (KR)

(72) Inventors: Je Guen Yu, Gyeonggi-do (KR); Aran An, Chungcheongbuk-do (KR); Wang Ki Choi, Chungcheongnam-do (KR); Eun Young Lee, Chungcheongnam-do (KR)

(73) Assignee: HANA MATERIALS INC., Cheonan-Si (KR)

( * ) Notice: Subject to any disclaimer, the term of this patent is extended or adjusted under 35 U.S.C. 154(b) by 526 days.

(21) Appl. No.: 18/354,022

(22) Filed: Jul. 18, 2023

(65) Prior Publication Data

US 2024/0038503 A1 Feb. 1, 2024

(30) Foreign Application Priority Data

Jul. 29, 2022 (KR) ........................ 10-2022-0094874

(51) Int. Cl.
*H01J 37/32* (2006.01)

(52) U.S. Cl.
CPC .. *H01J 37/32642* (2013.01); *H01J 37/32807* (2013.01)

(58) Field of Classification Search
CPC ............ C23C 16/4585; H01J 37/32642; H01J 37/32807
See application file for complete search history.

(56) References Cited

U.S. PATENT DOCUMENTS

| | | | | |
|---|---|---|---|---|
| 6,521,292 | B1 * | 2/2003 | Yudovsky | C23C 16/45521 118/500 |
| 7,244,336 | B2 | 7/2007 | Fischer et al. | |
| 7,678,225 | B2 * | 3/2010 | Nezu | H01J 37/32642 118/723 VE |
| 8,449,679 | B2 | 5/2013 | Dhindsa | |
| 10,847,348 | B2 | 11/2020 | Tsukahara et al. | |
| 11,380,526 | B2 | 7/2022 | Hayashi et al. | |
| 2005/0133165 | A1 * | 6/2005 | Liu | C23C 16/4401 156/345.51 |

(Continued)

FOREIGN PATENT DOCUMENTS

| | | | |
|---|---|---|---|
| CN | 114512389 | A | 5/2022 |
| JP | 2005347619 | A | 12/2005 |

(Continued)

OTHER PUBLICATIONS

Notice of Allowance received for Korean Patent Application No. 10-2022-0094874, mailed on Oct. 15, 2024. 5 pages.

*Primary Examiner* — Benjamin Kendall
(74) *Attorney, Agent, or Firm* — HoustonHogle LLP

(57) ABSTRACT

A focus ring and a method for manufacturing the same. The focus ring include a first ring made of a first material, a second ring covered by the first ring, wherein the second ring is made of a second material different from the first material, and a fastening member configured to couple the first ring to the second ring. The fastening member includes a through-part configured to pass through the second ring and a buried part buried in a lower portion of the first ring. The through-part has a first diameter, and the buried part has a second diameter greater than or equal to the first diameter.

15 Claims, 20 Drawing Sheets

(56) References Cited

U.S. PATENT DOCUMENTS

| | | | | |
|---|---|---|---|---|
| 2011/0031111 | A1* | 2/2011 | Kobayashi | H01J 37/32623<br>204/298.36 |
| 2020/0365378 | A1 | 11/2020 | Kellogg et al. | |
| 2021/0183685 | A1 | 6/2021 | Lee et al. | |

FOREIGN PATENT DOCUMENTS

| | | | | | |
|---|---|---|---|---|---|
| JP | 2007515081 | A | | 6/2007 | |
| JP | 2011054933 | A | | 3/2011 | |
| JP | 2012500470 | A | | 1/2012 | |
| JP | 2021097102 | A | | 6/2021 | |
| JP | 2021515383 | A | | 6/2021 | |
| KR | 20080060726 | A | * | 7/2008 | H10P 72/0421 |
| KR | 101131022 | B1 | | 3/2012 | |
| KR | 20170025472 | A | * | 3/2017 | H01L 21/3065 |
| KR | 102102131 | B1 | | 4/2020 | |
| KR | 102128595 | B1 | * | 7/2020 | H10P 72/0421 |
| KR | 102175990 | B1 | * | 11/2020 | H01J 37/32642 |
| TW | 202002072 | A | | 1/2020 | |
| TW | 202109603 | A | | 3/2021 | |

* cited by examiner

FOCUS RING AND METHOD FOR MANUFACTURING THE SAME

CROSS-REFERENCE TO RELATED APPLICATIONS

This U.S. non-provisional patent application claims priority under 35 U.S.C. § 119 of Korean Patent Application No. 10-2022-00094874, filed on Jul. 29, 2022, the entire contents of which are hereby incorporated by reference.

BACKGROUND

The present disclosure herein relates to a focus ring and a method for manufacturing the same, and more particularly, to a focus ring used for semiconductor plasma etching and a method for manufacturing the same.

In general, a semiconductor element is completed by repeatedly performing a manufacturing process on a silicon wafer. A semiconductor manufacturing process includes oxidation, masking, photoresist coating, etching, diffusion, and lamination processes for a wafer that is a target material. In addition, processes such as washing, drying, and inspection should be performed before and after the above processes. Particularly, the etching process is an important process for substantially forming a pattern on the wafer. The etching process may be largely divided into wet etching and dry etching.

The dry etching process is a process of removing an exposed portion of a photoresist pattern formed after a photo process. High-frequency power is applied to an upper electrode and a lower electrode, which are installed to be spaced a predetermined distance from each other in a sealed inner space to generate an electric field, and a reaction gas supplied into the sealed space is activated by the electric field to become a plasma state, and then, a wafer disposed on the lower electrode is etched by ions that are in the plasma state.

The plasma may be concentrated over an area of an entire top surface of the wafer. For this, a focus ring is disposed to surround a circumference of a chuck body disposed above the lower electrode.

The focus ring concentrates the electric field formation area formed above the chuck body by applying the high-frequency power to the area on which the wafer is disposed, and the wafer is disposed at a center of the area on which the plasma is generated and etched uniformly as a whole.

SUMMARY

The present disclosure provides a focus ring, in which different materials having excellent durability are laminated, and a method for manufacturing the same.

An embodiment of the inventive concept provides a focus ring including: a first ring made of a first material; a second ring covered by the first ring, wherein the second ring is made of a material different from that of the first material; and a fastening member configured to couple the first ring to the second ring. The fastening member may include: a through-part configured to pass through the second ring; and a buried part buried in a lower portion of the first ring, wherein the through-part may have a first diameter, and the buried part may have a second diameter greater than or equal to the first diameter.

In an embodiment of the inventive concept, a method for manufacturing a focus ring includes: forming a recess in a first ring made of a first material; forming a through-hole in a second ring made of a second material different from the first material; laminating the first ring and the second ring so that the recess and the through-hole are aligned with each other, wherein the recess and the through-hole communicate with each other to form a coupling groove; providing a bond composition in the coupling groove; and curing the bond composition to form a fastening member that couples the first ring and the second ring to each other. The through-hole may have a first diameter, and the recess may have a second diameter greater than or equal to the first diameter.

BRIEF DESCRIPTION OF THE FIGURES

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings.

DETAILED DESCRIPTION

Figure 1:
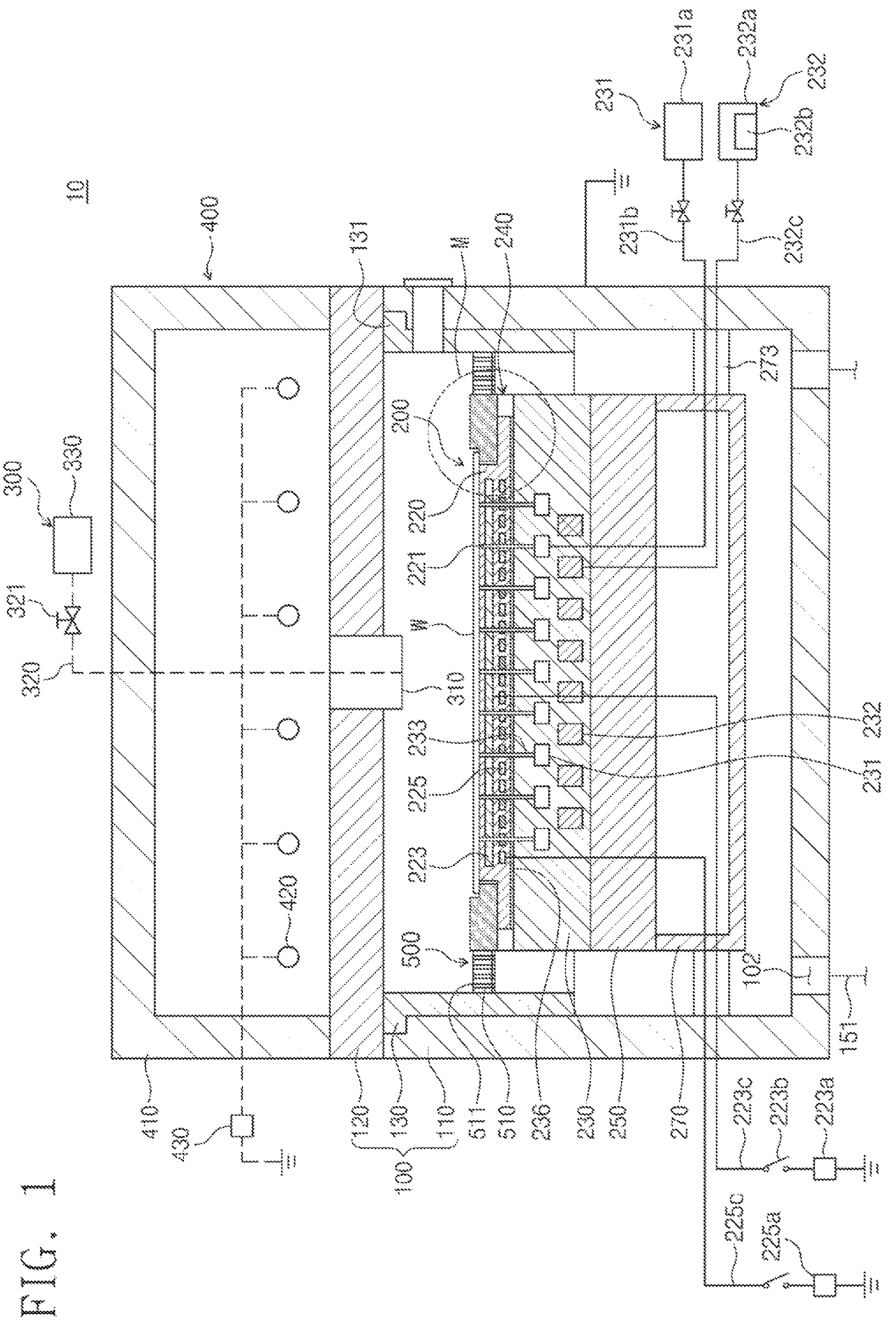
FIG. 1 is a schematic view for explaining a plasma device according to embodiments of the inventive concept.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

Further, the present invention is only defined by scopes of claims. Like reference numerals refer to like elements throughout.

In the following description, the technical terms are used only for explaining a specific exemplary embodiment while not limiting the present invention. In this specification, the terms of a singular form may comprise plural forms unless specifically mentioned. The meaning of 'comprises' and/or 'comprising' specifies a component, a step, an operation and/or an element does not exclude other components, steps, operations and/or elements. Hereinafter, embodiments according to the inventive concept will be described in detail.

As an embodiment of the inventive concept, a plasma device for processing a substrate by generating plasma in an inductively coupled plasma (ICP) method will be described. However, embodiments of the inventive concept are not limited thereto and may be applied to various types of devices for processing substrates using plasma such as a capacitively coupled plasma (CCP) method or a remote plasma method.

Also, in an embodiment of the inventive concept, an electrostatic chuck as a support unit will be described as an example. However, embodiments of the inventive concept are not limited thereto, and the support unit may support a substrate by mechanical clamping or vacuum.

FIG. 1 is a schematic view for explaining a plasma device according to embodiments of the inventive concept.

Referring to FIG. 1, a plasma device 10 may process a substrate W using plasma. For example, the plasma device 10 may perform an etching process using the plasma on the substrate W. The plasma device 10 may include a chamber 100, a support unit 200, a gas supply unit 300, a plasma source 400, and an exhaust unit 500.

The chamber 100 may have a processing space in which the substrate W is processed. The chamber 100 may include a housing 110 and a cover 120.

A top surface of the housing 110 may be opened. That is, the inner space of the housing 110 may be opened. The inner space of the housing 110 may serve as a processing space in which a substrate processing process is performed. The housing 110 may include a metal material. For example, the housing 110 may include aluminum. The housing 110 may be grounded.

An exhaust hole 102 may be provided in a bottom surface of the housing 110. The exhaust hole 102 may be connected to an exhaust line 151. Reaction by-products generated during the process and a gas remaining in the inner space of the housing 110 may be discharged to the outside through the exhaust line 151. The inside of the housing 110 may be reduced to a predetermined pressure by an exhausting process.

The cover 120 may cover an opened top surface of the housing 110. The cover 120 has a plate shape and may seal the inner space of the housing 110. The cover 120 may include a dielectric substance window.

A liner 130 may be provided inside the housing 110. The liner 130 may have an inner space with opened top and bottom surfaces. That is to say, the liner 130 may have a cylindrical shape. The liner 130 may have a radius corresponding to an inner surface of the housing 110. The liner 130 may extend downward along the inner surface of the housing 110.

The liner 130 may include a support ring 131 on an upper portion thereof. The support ring 131 may have a ring shape and may protrude outward from the liner 130 along a circumference of the liner 130. The support ring 131 may be provided on the upper portion of the housing 110 to support the liner 130.

The liner 130 may include the same material as the housing 110. For example, the liner 130 may include aluminum. The liner 130 may protect the inner surface of the housing 110. For example, an arc discharge may be generated inside the chamber 100 while the process gas is excited. The arc discharge may damage peripheral devices. The liner 130 may protect the inner surface of the housing 110 from being damaged by the arc discharge. In addition, reaction byproducts generated during the substrate processing process may be prevented from being deposited on an inner wall of the housing 110. The liner 130 may be cheaper than the housing 110 and may be easily replaced. Thus, when the liner 130 is damaged due to the arc discharge, the damaged liner 130 may be replaced with a new liner 130.

The support unit 200 may support the substrate W within the processing space inside the chamber 100. For example, the support unit 200 may be disposed inside the housing 110. The support unit 200 may be provided in an electrostatic chuck method for adsorbing the substrate W using electrostatic force. As another example, the support unit 200 may support the substrate W in various manners such as mechanical clamping. Hereinafter, the support unit 200 provided in the electrostatic chuck method will be described.

The support unit 200 may include chucks 220, 230, and 250 and an edge ring 240. The chucks 220, 230, and 250 may support the substrate W during the process. The chucks 220, 230, and 250 may include a support plate 220, a passage forming plate 230, and an insulating plate 250.

The support plate 220 may be disposed at an upper portion of the support unit 200. The support plate 220 may be made of a disk-shaped dielectric substance. For example, the support plate 220 may include quartz. The substrate W may be disposed on a top surface of the support plate 220. The top surface of the support plate 220 may have a radius less than that of the substrate W. A first supply passage 221 used as a passage through which a heat transfer gas is supplied to a bottom surface of the substrate W may be provided in the support plate 220. An electrostatic electrode 223 and a heater 225 may be buried in the support plate 220.

The electrostatic electrode 223 may be disposed on the heater 225. The electrostatic electrode 223 may be electrically connected to a first lower power supply **223*a*. The electrostatic force may act between the electrostatic electrode 223 and the substrate W by current applied to the electrostatic electrode 223, and the substrate W may be adsorbed to the support plate 220** by the electrostatic force.

The heater 225 may be electrically connected to a second lower power supply **225*a*. The heater 225 may generate heat by resisting the current applied from the second lower power supply 225*a*. The generated heat may be transferred to the substrate W through the support plate 220. The substrate W may be maintained at a set temperature by the heat generated by the heater 225. The heater 225** may include a spiral coil.

The passage forming plate 230 may be provided below the support plate 220. A bottom surface of the support plate 220 and a top surface of the passage forming plate 230 may be bonded to each other by an adhesive 236. A first circulation passage 231, a second circulation passage 232, and a second supply passage 233 may be provided in the passage forming plate 230. The first circulation passage 231 may serve as a passage through which the heat transfer gas is circulated. The second circulation passage 232 may serve as a passage through which a cooling fluid is circulated. The second supply passage 233 may connect the first circulation passage 231 to the first supply passage 221. For example, the passage forming plate 230 may include quartz.

In an embodiment, the first circulation passage 231 may be provided in a spiral shape inside the passage forming plate 230. In another embodiment, the first circulation passage 231 may include ring-shaped passages having radii different from each other. The ring-shaped passages may be arranged to have the same central axis.

The first circulation passage 231 may be connected to a heat transfer medium storage unit 231*a* through a heat transfer medium supply line 231*b*. A heat transfer medium may be stored in the heat transfer medium storage unit 231*a*. The heat transfer medium may include an inert gas. In an embodiment, the heat transfer medium may include a helium (He) gas. The helium gas may be supplied to the first circulation passage 231 through the supply line 231*b* and may sequentially pass through the second supply passage 233 and the first supply passage 221 so as to be supplied to the bottom surface of the substrate W. The helium gas may serve as a medium to help heat exchange between the substrate W and the support plate 220. Thus, a temperature of the entire substrate W may be uniform.

The second circulation passage 232 may be connected to the cooling fluid storage unit 232*a* through a cooling fluid supply line 232*c*. A cooling fluid may be stored in the cooling fluid storage unit 232*a*. A cooler 232*b* may be provided in the cooling fluid storage unit 232*a*. The cooler 232*b* may cool the cooling fluid to a predetermined temperature. Alternatively, the cooler 232*b* may be installed on the cooling fluid supply line 232*c*. The cooling fluid supplied to the second circulation passage 232 through the cooling fluid supply line 232*c* may be circulated along the second circulation passage 232 to cool the passage forming plate 230. While the passage forming plate 230 is cooled, the support plate 220 and the substrate W may be cooled together to maintain the substrate W at a predetermined temperature. For the reason described above, the lower portion of the edge ring 240 may have a temperature less than that of the upper portion of the edge ring 240.

An insulating plate 250 may be provided under the passage forming plate 230. The insulating plate 250 may include an insulating material and may electrically insulate the passage forming plate 230 from the lower cover 270.

The lower cover 270 may be provided under the support unit 200. The lower cover 270 may be vertically spaced apart from the bottom of the housing 110. The lower cover 270 may have an inner space with an opened top surface. The top surface of the lower cover 270 may be covered by the insulating plate 250. Thus, an outer radius of a cross-section of the lower cover 270 may be provided at the same length as an outer radius of the insulating plate 250. A lift pin may be disposed in the inner space of the lower cover 270 to receive the transferred substrate W from an external transfer member so that the substrate W is seated on the support plate 220.

The lower cover 270 may include a connection member 273. The connection member 273 may connect an outer surface of the lower cover 270 to the inner wall of the housing 110. A plurality of connection members 273 may be provided on the outer surface of the lower cover 270 at regular intervals. The connection member 273 may support the support unit 200. In addition, the connection member 273 may be connected to the inner wall of the housing 110 so that the lower cover 270 is grounded. A first power line 223*c* connected to the first lower power supply 223*a*, a second power line 225*c* connected to the second lower power supply 225*a*, a heat transfer medium supply line 231*b* connected to the heat transfer medium storage unit 231*a*, and a cooling fluid supply line 232*c* connected to the cooling fluid storage unit 232*a* may extend into the lower cover 270 through the inner space of the connection member 273.

The gas supply unit 300 may supply a process gas to the processing space inside the chamber 100. The gas supply unit 300 may include a gas supply nozzle 310, a gas supply line 320, and a gas storage unit 330. The gas supply nozzle 310 may be provided at a central portion of the cover 120. An injection hole may be formed in a bottom surface of the gas supply nozzle 310. The process gas may be supplied into the chamber 100 through the injection hole.

The gas supply line 320 may connect the gas supply nozzle 310 to the gas storage unit 330. The gas supply line 320 may supply the process gas stored in the gas storage unit 330 to the gas supply nozzle 310. A valve 321 may be provided in the gas supply line 320. The valve 321 may open and close the gas supply line 320 and may adjust a flow rate of the process gas supplied through the gas supply line 320.

The plasma source 400 may generate plasma from the process gas supplied into the chamber 100. The plasma source 400 may be provided outside the processing space of the chamber 100. In an embodiment, an inductively coupled plasma (ICP) source may be used as the plasma source 400. The plasma source 400 may include an antenna chamber 410, an antenna 420, and a plasma power supply 430.

The antenna chamber 410 may have a cylindrical shape with an opened lower portion. The antenna chamber 410 may have a diameter corresponding to that of the chamber 100. A lower end of the antenna chamber 410 may be detachably provided on the cover 120.

The antenna 420 may be disposed inside the antenna chamber 410. The antenna 420 may have a spiral coil shape. The antenna 420 may be connected to the plasma power supply 430. The antenna 420 may receive power from the plasma power supply 430. The plasma power supply 430 may be disposed outside the chamber 100. The antenna 420 to which power is applied may form an electromagnetic field in the processing space of the chamber 100. The process gas may be excited into a plasma state by the electromagnetic field.

The exhaust unit 500 may be provided between the inner wall of the housing 110 and the support unit 200. The exhaust unit 500 may include an exhaust plate 510 in which a through-hole 511 is defined. The exhaust plate 510 may have an annular ring shape. A plurality of through-holes 511 may be provided in the exhaust plate 510. The process gas provided in the housing 110 may pass through the through-holes 511 of the exhaust plate 510 and then be exhausted to the exhaust hole 102. A flow of the process gas may be controlled according to the shapes of the exhaust plate 510 and the through-holes 511.

Figure 2:
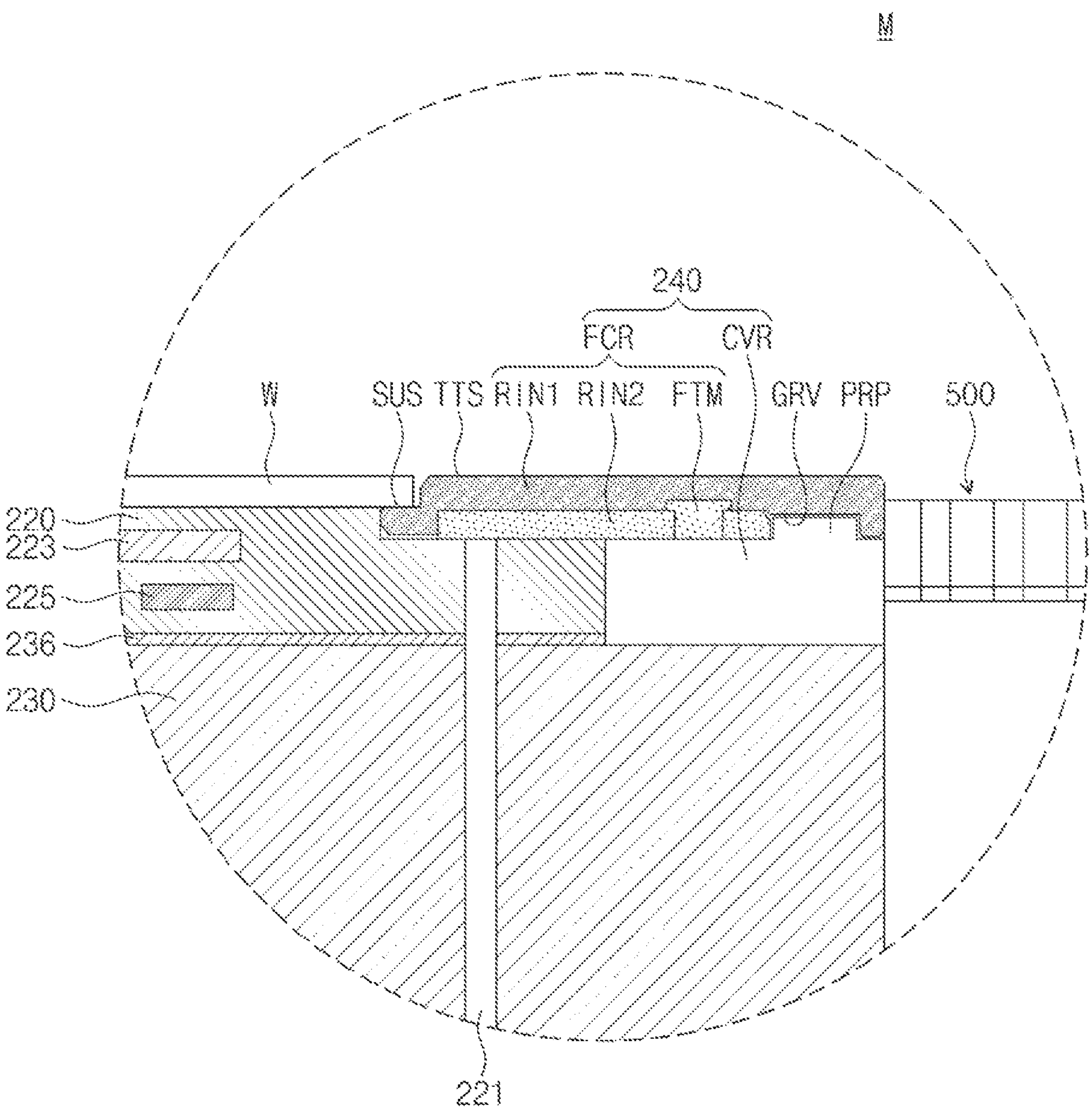
FIG. 2 is an enlarged cross-sectional view of an area M of FIG. 1 so as to explain an edge ring according to embodiments of the inventive concept.

FIG. 2 is an enlarged cross-sectional view of an area M of FIG. 1 so as to explain the edge ring according to embodiments of the inventive concept.

Referring to FIGS. 1 and 2, the edge ring 240 may be disposed on an edge area of the support unit 200. The edge ring 240 may have a ring shape and may be provided to surround an edge of the support plate 220. For example, the edge ring 240 may be disposed along a circumference of the support plate 220.

The edge ring 240 may control an interface between a sheath and/or plasma. The edge ring 240 may include a focus ring FCR and a cover ring CVR. The cover ring CVR may be provided below the focus ring FCR. The cover ring CVR may include a protrusion PRP that protrudes vertically from a top surface thereof. For example, the cover ring CVR may include an insulator such as quartz.

The focus ring FCR may include a first ring RIN1 disposed at an upper portion thereof, a second ring RIN2 disposed at a lower portion thereof, and at least one fastening member FTM that couples the first ring RIN1 to the second ring RIN2. The fastening member FTM may have a shape similar to that of a bolt, which will be described in detail later.

A top surface of the first ring RIN1 may be exposed. The top surface of the first ring RIN1 may include a support surface SUS and an uppermost surface TTS. The support surface SUS may be provided at the same height as the top surface of the support plate 220 and may be in contact with a bottom surface of the edge of the substrate W. In another embodiment, the support surface SUS of the first ring RIN1 may be provided lower than the top surface of the support plate 220 by a predetermined dimension, and thus, the bottom surface of the edge of the substrate W and the support surface SUS may be spaced apart a predetermined distance from each other.

The top surface TTS of the first ring RIN1 may be higher than the support surface SUS. Due to the difference in height between the support surface SUS and the uppermost surface TTS, the interface of the sheath and the plasma and the electric field may be adjusted. As a result, the focus ring FCR may induce the plasma to be focused on the substrate W.

The second ring RIN2 may constitute a lower structure of the focus ring FCR. The second ring RIN2 may include a material different from that of the first ring RIN1. For example, the first ring RIN1 may include silicon carbide (SiC), and the second ring RIN2 may include silicon (Si). Silicon (Si) is less expensive than silicon carbide (SiC). When compared to a case in which the entire focus ring FCR is made of silicon carbide (SiC), the focus ring FCR of the inventive concept may be economical because only the externally exposed first ring RIN1 is made of silicon carbide (SiC).

The fastening member FTM may have a bolt shape passing through the second ring RIN2. The fastening member FTM may be bonded to the first and second rings RIN1 and RIN2 to couple the first and second rings RIN1 and RIN2 to each other. The fastening member FTM may include a ceramic or polymer material different from that of each of the first and second rings RIN1 and RIN2.

The cover ring CVR may be provided below the focus ring FCR. The cover ring CVR may have a ring shape surrounding an outer circumferential surface of the support plate 220. The cover ring CVR may prevent the bottom of the focus ring FCR from being exposed to the plasma. The protrusion PRP of the cover ring CVR may be engaged with a groove GRV of the focus ring FCR.

In another embodiment of the inventive concept, although not shown, a coupler may be further provided under the cover ring CVR. The coupler may fix the cover ring CVR on the passage forming plate 230. The coupler may include a material having high thermal conductivity. As an example, the coupler may include a metal such as aluminum. The coupler may be bonded to the top surface of the passage forming plate 230 by using a thermally conductive adhesive. The cover ring CVR may be bonded to a top surface of the coupler by the thermally conductive adhesive. For example, the thermally conductive adhesive may include a silicon pad.

In an embodiment of the inventive concept, the first supply passage 221 may be provided under the focus ring FCR. A helium gas may be supplied between the support plate 220 and the focus ring FCR through the first supply passage 221. The helium gas may control a temperature of the focus ring FCR during an operation of the plasma device 10. Uniformity of the plasma may be controlled by controlling the temperature of the focus ring FCR using the helium gas.

The helium gas supplied through the first supply passage 221 may flow along a gap between the second ring RIN2 and the support plate 220. During the operation of the plasma device 10, the support plate 220 and the second ring RIN2 may be in close contact with each other to prevent the helium gas from leaking from the focus ring FCR.

Figure 3:
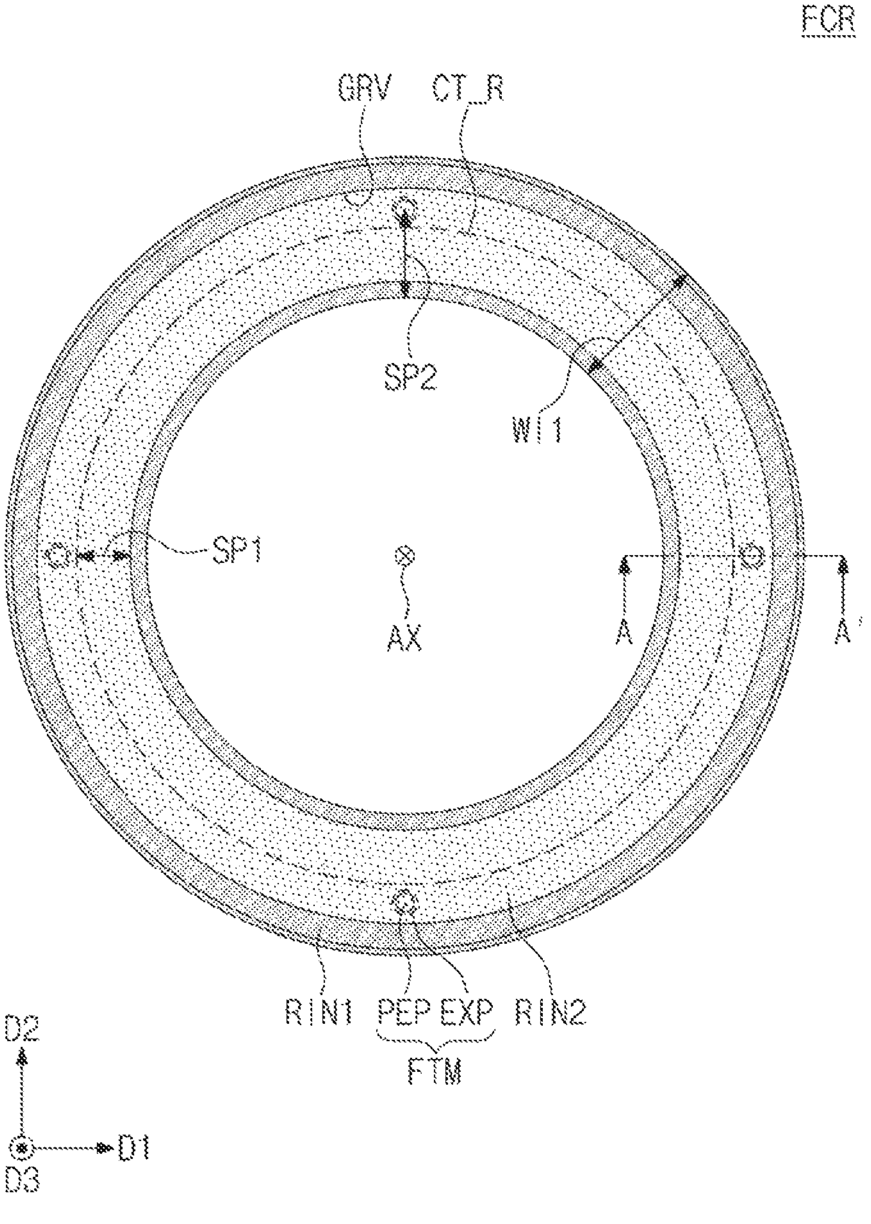
FIG. 3 is a plan view illustrating a bottom surface of a focus ring according to embodiments of the inventive concept.
Figure 4:
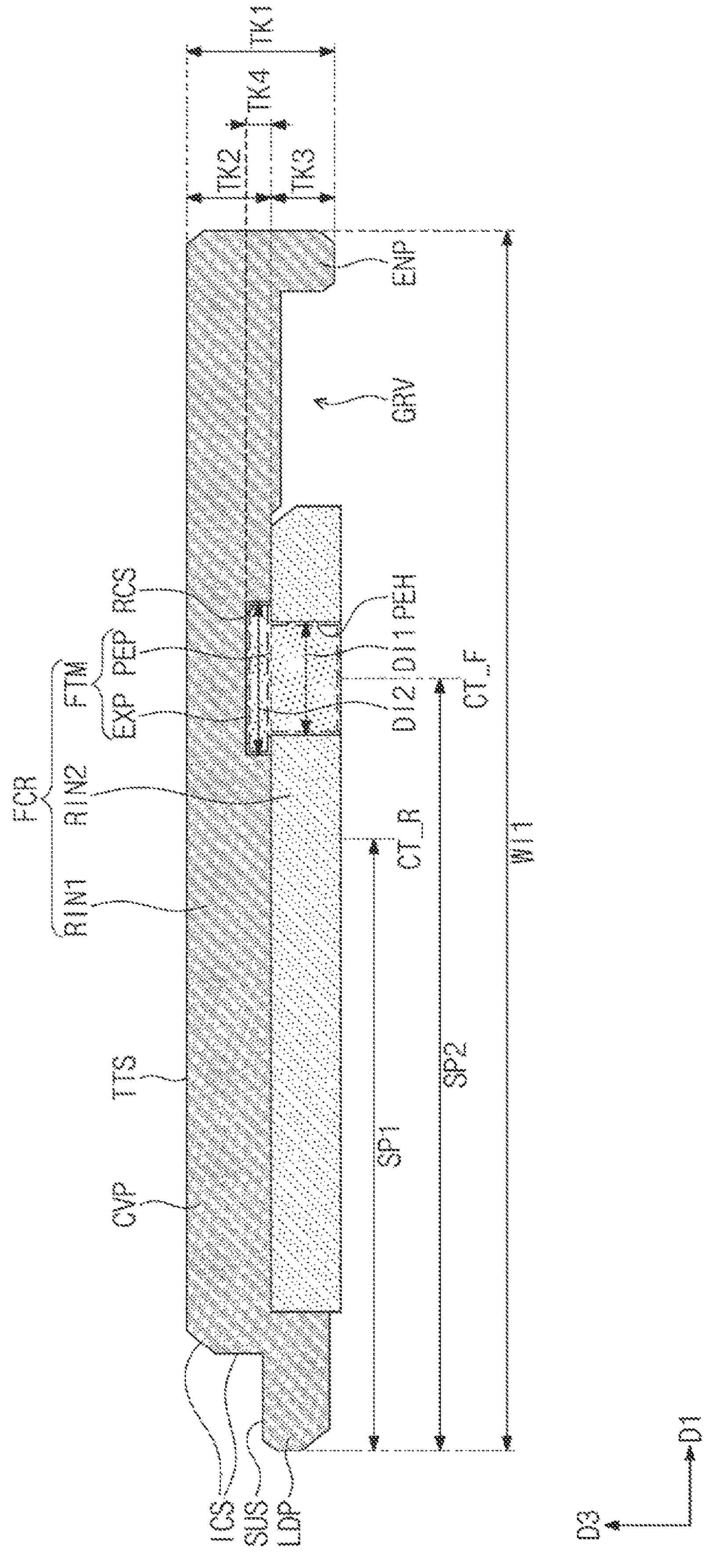
FIG. 4 is a cross-sectional view taken along line A-A' of FIG. 3.
Figure 5:
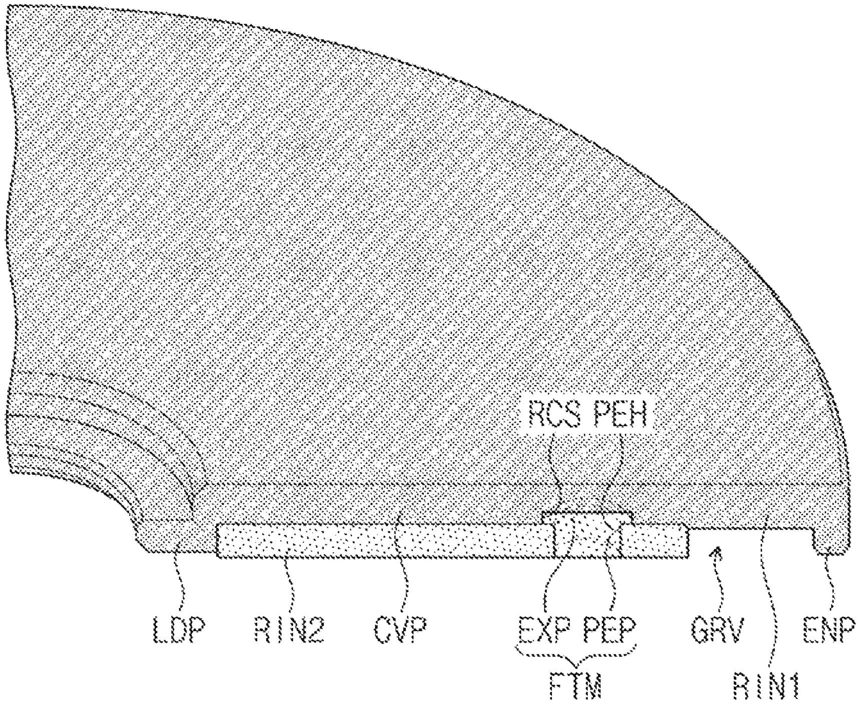
FIG. 5 is a perspective view illustrating a portion of the focus ring of FIG. 3.

FIG. 3 is a plan view illustrating a bottom surface of the focus ring according to embodiments of the inventive concept. FIG. 4 is a cross-sectional view taken along line A-A' of FIG. 3. FIG. 5 is a perspective view illustrating a portion of the focus ring of FIG. 3.

Referring to FIGS. 3 to 5, the focus ring FCR may include a first ring RIN1, a second ring RIN2, and a plurality of fastening members FTM. The plurality of fastening members FTM may couple the first ring RIN1 to the second ring RIN2.

The first ring RIN1 may have a ring shape having a central axis AX in a third direction D3. The second ring RIN2 may have a ring shape having the same central axis AX as the first ring RIN1. For example, the first ring RIN1 may include a first material, and the second ring RIN2 may include a second material different from the first material.

The first material and the second material may be selected from different materials from the group consisting of silicon carbide (SiC), silicon (Si), and boron carbide. The boron carbide may be selected from the group consisting of $B_2C$, $B_3C$, $B_4C$, $B_5C$, $B_{13}C_2$, $B_{13}C_3$, $B_{50}C_2$, or a combination thereof. For example, the first ring RIN1 may include silicon carbide (SiC), and the second ring RIN2 may include silicon (Si).

The first ring RIN1 may include a cover part CVP provided on the second ring RIN2 to cover the second ring RIN2, a loading part LDP disposed inside the cover part CVP, and an outer part ENP disposed outside the cover part CVP. The meaning 'disposed inside' used in this specification may mean that it is disposed closer to the central axis AX (see FIG. 3). The meaning 'disposed outside' used in this specification may mean that it is disposed farther from the central axis AX.

The loading part LDP of the first ring RIN1 may be provided at a lower level than that of the cover part CVP. A top surface of the loading part LDP may include the support surface SUS. A top surface of the cover part CVP may include the top surface TTS. An inclined surface ICS connecting the support surface SUS of the loading part LDP to the top surface TTS of the cover part CVP may be provided. The inclined surface ICS may extend vertically or obliquely from the support surface SUS to the uppermost surface TTS.

As described above with reference to FIG. 2, the support surface SUS of the loading part LDP may seat the substrate W. The top surface TTS may be disposed higher than the support surface SUS. The inclined surface ICS may connect the support surface SUS to the uppermost surface TTS, and the interface between the sheath and the plasma and the electric field may be controlled through the inclined surface ICS. That is to say, the inclined surface ICS may induce the plasma to be concentrated onto the substrate W.

When the process using the above-described plasma device of FIG. 1 is performed, the focus ring FCR may have a thickness that is gradually reduced as the upper portion thereof is etched by the plasma. When the upper portion of the focus ring FCR is etched to be thinned, the interface between the sheath and the plasma may be changed on the outer region of the substrate W. This may affect the plasma processing of the substrate W. Therefore, when the focus ring FCR becomes thinner than a certain thickness, the focus ring FCR has to be replaced.

In the focus ring FCR according to embodiments of the inventive concept, the first ring RIN1 may be provided on the second ring RIN2 to cover the second ring RIN2. Thus, only the first ring RIN1 may be exposed to the plasma, and the second ring RIN2 may not be exposed to the plasma due to the first ring RIN1.

When compared to the first ring RIN1 (e.g., silicon carbide), costs of the second ring RIN2 (e.g., silicon) may be inexpensive, but the etch resistance to plasma may be low. According to embodiments of the inventive concept, only the first ring RIN1 having high etching resistance to plasma may be exposed to the plasma. As a result, a replacement cycle of the focus ring FCR may increase. In addition, since the second ring RIN2 occupies about ⅓ of the total volume of the focus ring FCR, the focus ring FCR of the inventive concept may be economically manufactured.

The outer part ENP of the first ring RI 1 may be provided on an outer circumferential surface of the cover part CVP. The outer part ENP may extend downward from the cover part CVP. The outer part ENP may be horizontally spaced apart from the outer circumferential surface of the second ring RIN2. A groove GRV may be defined between the outer part ENP of the first ring RIN1 and the second ring RIN2. The groove GRV may have a ring shape having the same central axis AX as the first ring RIN1. As described above, the groove GRV may be coupled to the protrusion PRP of the cover ring CVR.

The fastening member FTM may include a through-part PEP passing through the second ring RIN2 and a buried part EXP on the through-part PEP. The buried part EXP may be buried under the first ring RIN1. Specifically, the second ring RIN2 may include a through-hole PEH passing therethrough. The through-part PEP of the fastening member FTM may be provided in the through-hole PEH. The first ring RIN1 may include a circular recess RCS at a lower portion thereof. The buried part EXP of the fastening member FTM may be provided in the recess RCS.

As an embodiment of the inventive concept, the through-part PEP may have a first diameter DI1, and the buried part EXP may have a second diameter DI2. The second diameter DI2 may be larger than the first diameter DI1. That is, the fastening member FTM may have a bolt shape in which a screw thread is omitted. A ratio (DI2/DI1) of the second diameter DI2 to the first diameter DI1 may be about 1.1 to about 2. When considering the embodiment of FIG. 14 to be described later, the ratio (DI2/DI1) of the second diameter DI2 to the first diameter DI1 may be about 1 to about 2. When the ratio (DI2/DI1) is greater than about 2, the buried part EXP may not be completely filled into the recess RCS, and an air gap may occur in the recess RCS.

The fastening member FTM may include a ceramic material different from that of each of the first and second rings RIN1 and RIN2. For example, the fastening member FTM may include at least one selected from the group consisting of zirconium oxide, zirconium silicon oxide, aluminum oxide, yttrium oxide, magnesium oxide, silicon carbide, and aluminum nitride.

As an embodiment of the inventive concept, the fastening member FTM may have a temperature limit of about 1,300° C. to about 1,700° C. For example, the temperature limit of the fastening member FTM may be similar to or higher than a melting point of silicon (Si).

In another embodiment of the inventive concept, the temperature limit of the fastening member FTM may be less than the melting point of silicon (Si). In other words, the fastening member FTM may be removed by being heated at a temperature lower than the melting point of silicon (Si). In this case, the fastening member FTM may be removed without damaging the second ring RIN2 made of silicon. Thus, the first ring RIN1 worn (or etched) by the exposure to plasma may be separated from the second ring RIN2, and the second ring RIN2 may be reused again.

A first center line CT_R passing through a center of the first ring RIN1 may be defined. As illustrated in FIG. 3, the first center line CT_R may have a circular shape having the central axis AX. A distance from an inner circumferential surface of the first ring RIN1 to the first center line CT_R may be a first distance SP1. The first ring RIN1 may have a first width WI1 in the first direction D1. In this case, the first distance SP1 may be half of the first width WI1 (i.e., WI1/2).

The fastening member FTM may be disposed outside the first center line CT_R. A second center line CT_F passing through a center of the fastening member FTM may be defined. The second center line CT_F may be offset from the first center line CT_R. For example, the second center line CT_F may be offset from the first center line CT_R in the first direction D1. A distance from the inner circumferential surface of the first ring RIN1 to the second center line CT_F may be a second distance SP2. The second distance SP2 may be greater than the first distance SP1.

Referring back to FIG. 2, since the fastening member FTM is disposed outside the first center line CT_R, the fastening member FTM may be disposed on the cover ring CVR rather than the support plate 220. If the fastening member FTM is disposed on the support plate 220 (electrostatic chuck), electrostatic force between the support plate 220 and the focus ring FCR may decrease. As a result, a limitation in that the focus ring FCR is unstably fixed on the support plate 220 may occur during the operation of the plasma device 10.

Since the fastening member FTM according to the inventive concept is disposed on the cover ring CVR outside the support plate 220, the electrostatic force between the support plate 220 and the focus ring FCR may be maintained as it is. As a result, the focus ring FCR may be stably fixed on the support plate 220 during the operation of the plasma device 10.

Thus, the fastening member FTM has to be disposed between an end of the support plate 220 in a horizontal direction and an end of the second ring of the focus ring in the horizontal direction.

Referring again to FIGS. 3 to 5, a maximum thickness of the first ring RIN1 may be a first thickness TK1. In other words, a thickness of the outer part ENP may be the first thickness TK1. A thickness of the cover part CVP of the first ring RIN1 may be a second thickness TK2. A thickness of the second ring RIN2 may be a third thickness TK3. The sum of the second thickness TK2 and the third thickness TK3 may be the first thickness TK1. For example, the first thickness TK1 may be about 2 mm to about 20 mm, but is not limited thereto.

A length (or thickness) of the through-part PEP of the fastening member FTM in the third direction D3 may be substantially equal to the third thickness TK3. A thickness of the buried part EXP of the fastening member FTM may be a fourth thickness TK4. The fourth thickness TK4 may be less than the second thickness TK2. A ratio (TK4/TK2) of the fourth thickness TK4 to the second thickness TK2 may be about 0.1 to about 0.7.

When the ratio (TK4/TK2) is less than about 0.1, coupling force between the first and second rings RIN1 and RIN2 may decrease, and thus, the first and second rings RIN1 and RIN2 may be detached from each other. When the ratio (TK4/TK2) is greater than about 0.7, the upper portion of the focus ring FCR may be etched by the plasma, and thus, the fastening member FTM may be immediately exposed. Thus, there is a limitation in that the replacement cycle of the focus ring FCR is shortened.

Referring back to FIG. 3, the number of plurality of fastening members FTM may be at least four. According to embodiments of the inventive concept, the number of fastening members FTM may be about 4 to about 24. For uniform coupling force between the first and second rings RIN1 and RIN2, the plurality of fastening members FTM may be uniformly distributed on the focus ring FCR.

Figure 6:
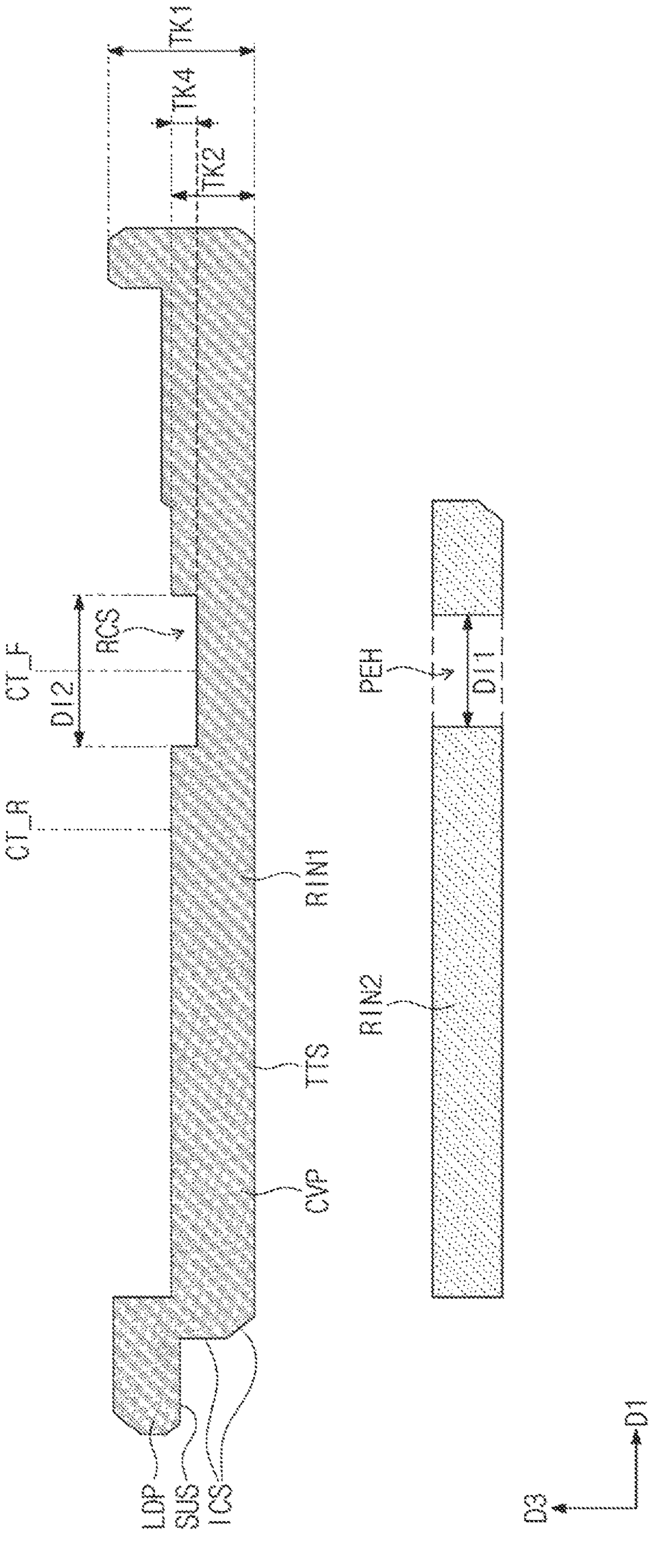
FIG. 6 is a cross-sectional view taken along line A-A' of FIG. 3 so as to explain a method for manufacturing a focus ring according to embodiments of the inventive concept.

FIG. 6 is a cross-sectional view taken along line A-A' of FIG. 3 so as to explain a method for manufacturing a focus ring according to embodiments of the inventive concept.

Referring to FIG. 6, a first ring RIN1 made of a first material and a second ring RIN2 made of a second material may be prepared. A round recess RCS may be formed by processing the first ring RIN1. The recess RCS may be formed outside a first center line CT_R passing through a center of the first ring RIN1. A second center line CT_F of the recess RCS may be horizontally offset from the first center line CT_R.

The recess RCS may be formed to have a depth corresponding to a fourth thickness TK4. A ratio (TK4/TK2) of the fourth thickness TK4 to a second thickness TK2 of a cover part CVP of the first ring RIN1 may be about 0.1 to about 0.7.

A through-hole PEH passing through the second ring RIN2 may be formed by processing the second ring RIN2. The through-hole PEH may be formed to be aligned with the recess RCS of the first ring RIN1. The through-hole PEH may have a first diameter DI1, and the recess RCS may have a second diameter DI2 greater than the first diameter DI1. For example, the ratio (DI2/DI1) of the second diameter DI2 to the first diameter DI1 may be about 1.1 to about 2.

Figure 7:
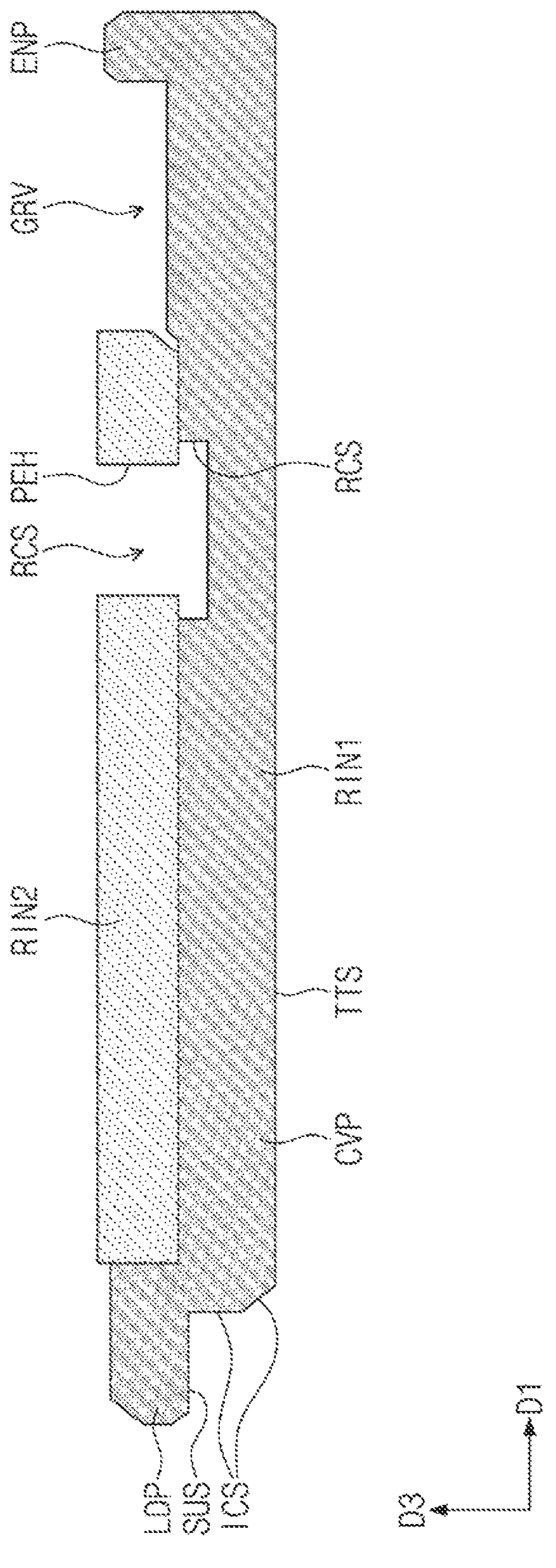
FIG. 7 is a plan view illustrating a bottom surface of a focus ring according to another embodiment of the inventive concept.

Referring to FIG. 7, an inverted second ring RIN2 may be stacked on an inverted first ring RIN1. The through-hole PEH of the second ring RIN2 may be aligned with the recess RCS of the first ring RIN1. A groove GRV may be defined between the outer part ENP of the first ring RIN1 and the second ring RIN2. The through-hole PEH and the recess RCS may communicate with each other to form one coupling groove FTH. The coupling groove FTH may be a bolt-shaped empty space.

Figure 8:
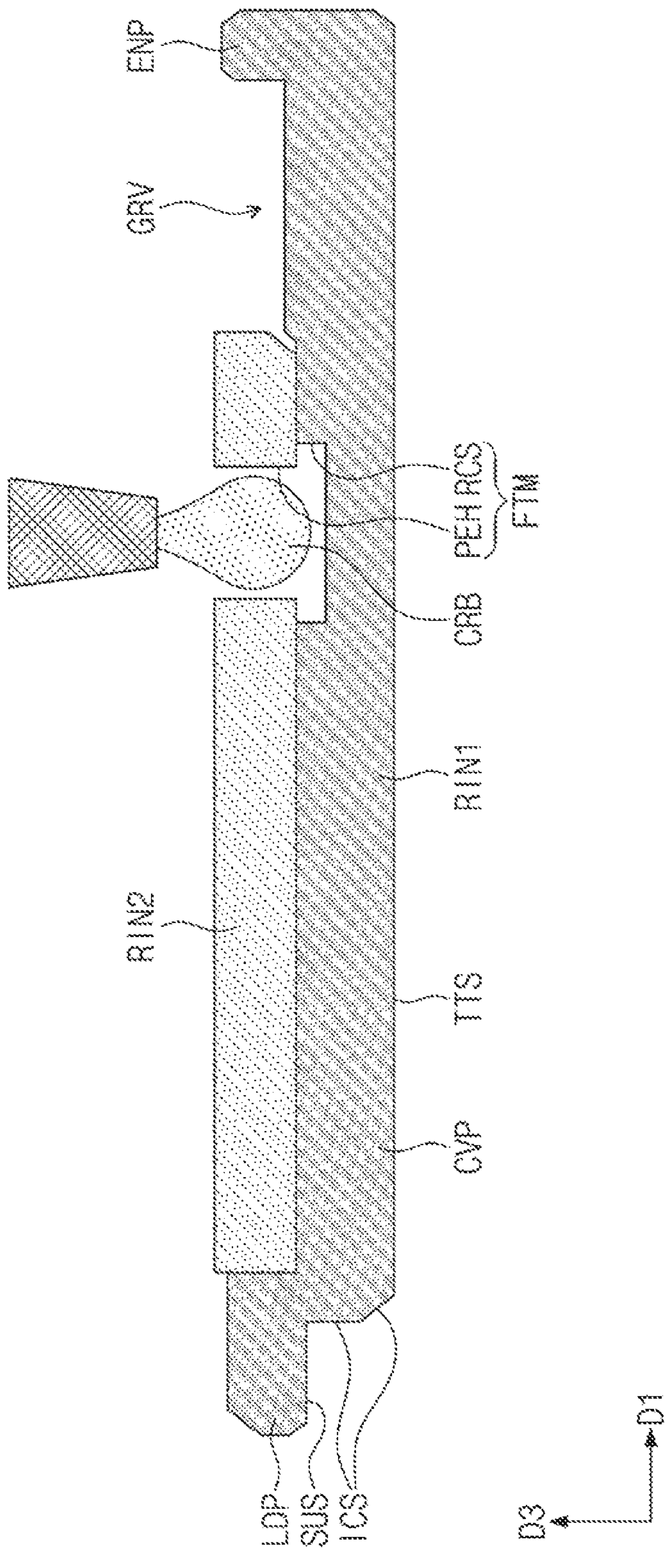
FIG. 8 is a plan view illustrating a bottom surface of a focus ring illustrating bond composition.

Referring to FIG. 8, a bond composition CRB may be provided in the coupling groove FTH. The bond composition CRB may be filled into the coupling groove FTH. In other words, the bond composition CRB may be filled into the through-hole PEH and the recess RCS.

In one embodiment of the inventive concept, the bond composition CRB may be an adhesive composition based on at least one ceramic selected from the group consisting of zirconium oxide, zirconium silicon oxide, aluminum oxide, yttrium oxide, magnesium oxide, silicon carbide, and aluminum nitride.

A viscosity of commercially available ceramic bond may have various viscosities depending on physical properties of the bond. The bond composition CRB of the inventive concept may have a viscosity that is sufficient to be completely filled into the coupling groove FTH. Thus, when the viscosity of the ceramic bond itself is too high, the viscosity of the bond composition CRB may be changed by adding additives (or diluting the ceramic bond) to inject the bond composition CRB deformed to a suitable viscosity into the coupling groove FTH.

As another embodiment of the inventive concept, an organic polymer-based bond composition CRB may be provided in the coupling groove FTH. For example, the bond composition CRB including a polyimide-based polymer may be provided in the coupling groove FTH.

Figure 9:
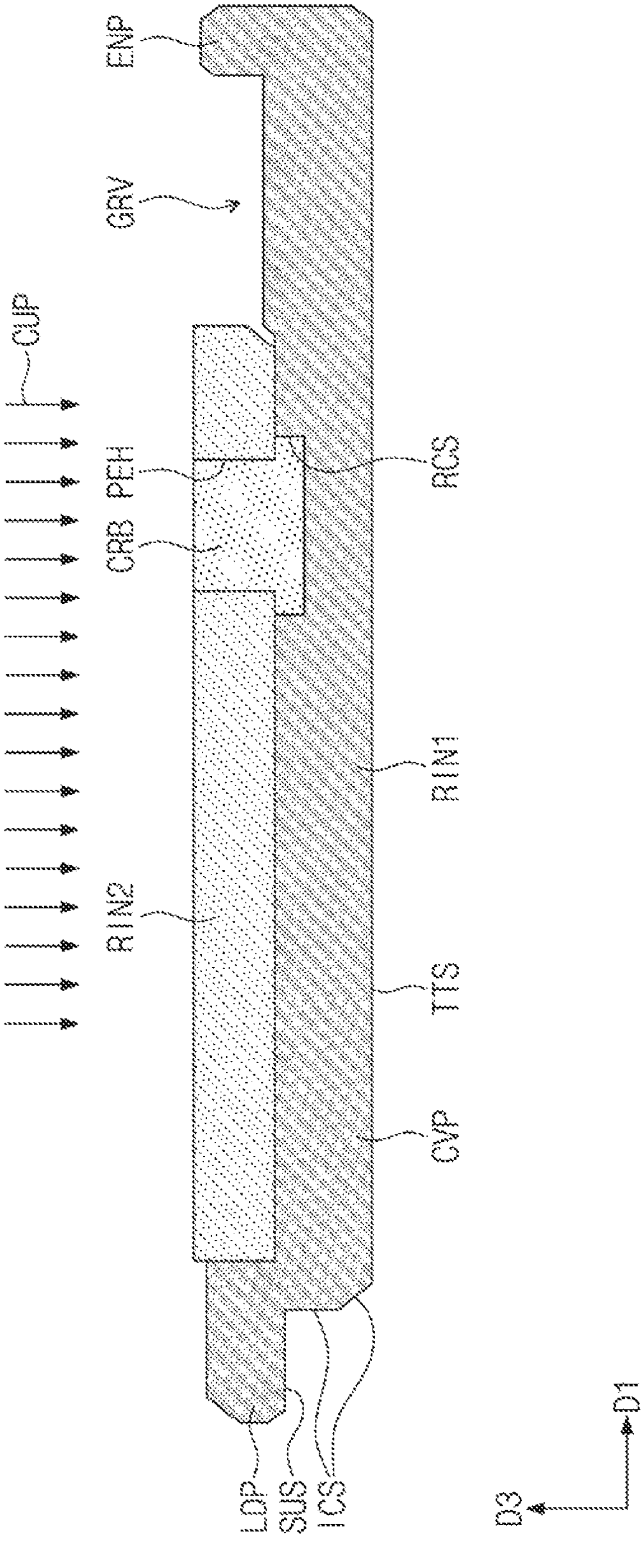
FIG. 9 is a plan view illustrating a bottom surface of a focus ring illustrating curing.

Referring to FIG. 9, a curing process CUP may be performed on the bond composition CRB filled in the coupling groove FTH. The curing process CUP may include a process of performing thermal curing on the bond composition CRB. For example, the curing process CUP may be performed at a temperature of about 80° C. to about 200° C. for about 1 hour to about 10 hours. Referring back to FIGS. 3 to 5, the bond composition CRB filled in the coupling groove FTH may be cured to form a ceramic or organic polymer-based fastening member FTM. The focus ring FCR according to the inventive concept may be manufactured by coupling the first and second rings RIN1 and RIN2 to each other by using the fastening member FTM. Since the cured bond composition CRB may have high strength, high temperature limit, and low thermal expansion coefficient, the focus ring FCR may be stably maintained under a plasma environment.

FIG. 7 is a plan view illustrating a bottom surface of a focus ring according to another embodiment of the inventive concept. FIG. 11 is a cross-sectional view taken along line A-A' of FIG. 10. In this embodiment, detailed descriptions of technical features that are duplicated with those described with reference to FIGS. 3 and 5 will be omitted, and differences will be described in detail.

Figure 10:
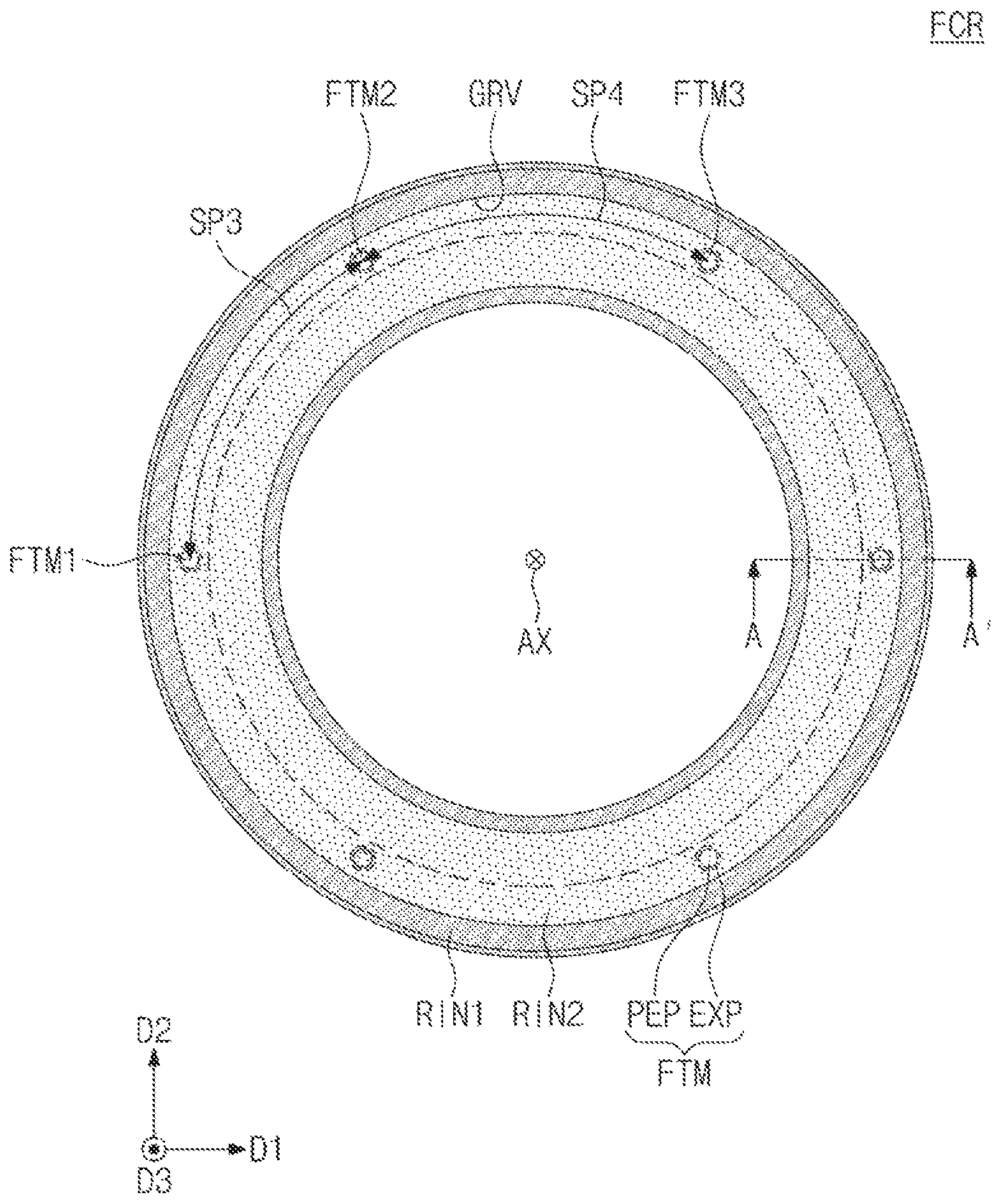
FIG. 10 is a plan view illustrating a bottom surface of a focus ring.
Figure 11:
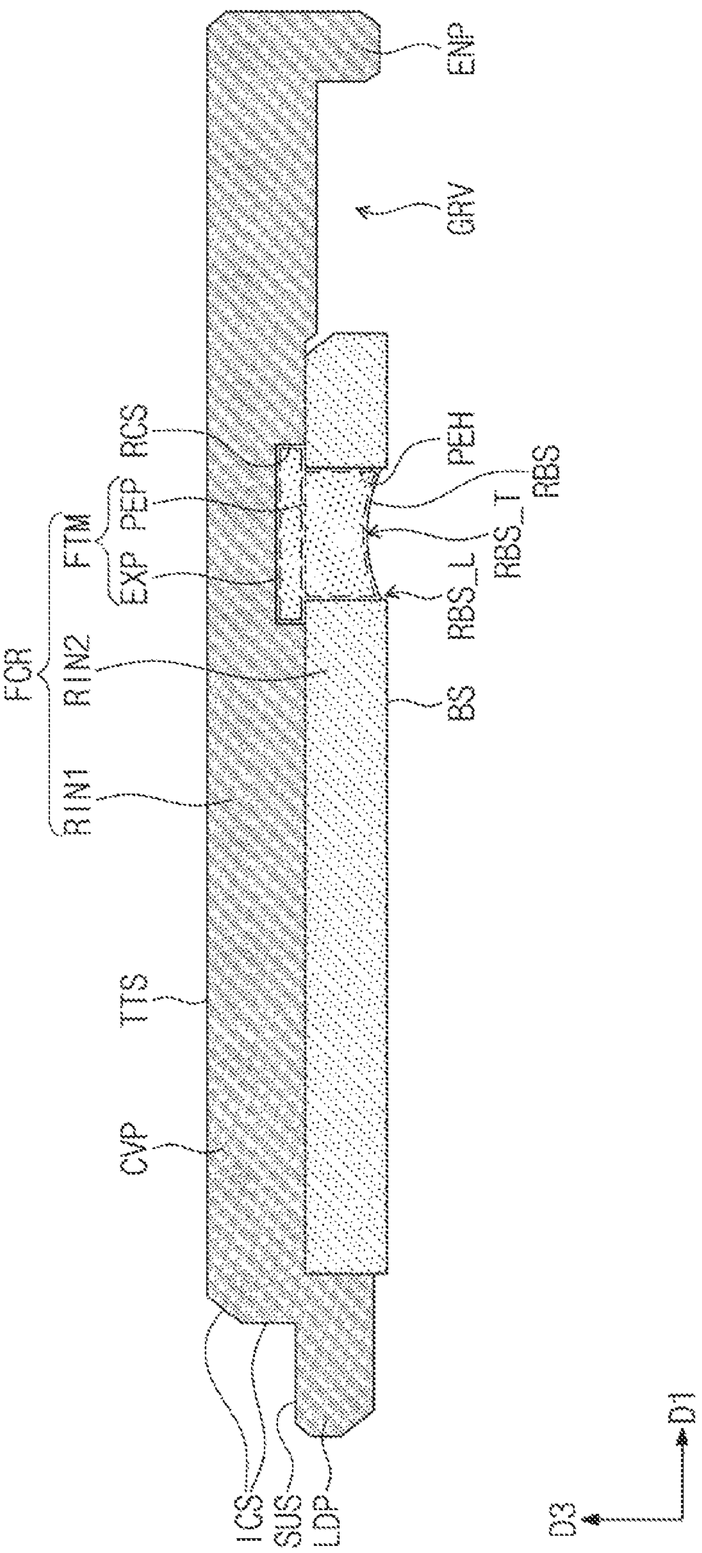
FIG. 11 is a cross-sectional view taken along line A-A' of FIG. 10.

Referring to FIGS. 10 and 11, the number of fastening members FTM provided in a focus ring FCR may be about six. The plurality of fastening members FTM may be arranged in a pattern having various regularities and increasing in coupling force in a clockwise direction. The fastening members FTM according to an embodiment of the inventive concept may be arranged at regular intervals to provide uniform coupling force between first and second rings RIN1 and RIN2.

For example, the plurality of fastening members FTM may include first, second, and third fastening members FTM1, FTM2, and FTM3, which are sequentially arranged in the clockwise direction. A distance between the first fastening member FTM1 and the second fastening member FTM2 may be a third distance SP3, and a distance between the second fastening member FTM2 and the third fastening member FTM3 may be a fourth distance SP4. Here, the third distance SP3 and the fourth distance SP4 may be substantially equal to each other.

Referring back to FIG. 11, the fastening member FTM may have a recessed bottom surface RSB_T. The recessed bottom surface RSB_T of the fastening member FTM may be recessed in a direction toward a buried part EXP. The recessed bottom surface RSB_T may include a lowest surface RBS_L at an edge thereof and a highest surface RBS_T at a center thereof. The highest surface RBS_T may be higher than the lowest surface RBS_L. The lowest surface RBS_L may be disposed at the same level as or higher than the bottom surface BS of the second ring RIN2. In one embodiment, the lowest surface RBS_L may be higher than the bottom surface BS of the second ring RIN2.

Figure 12:
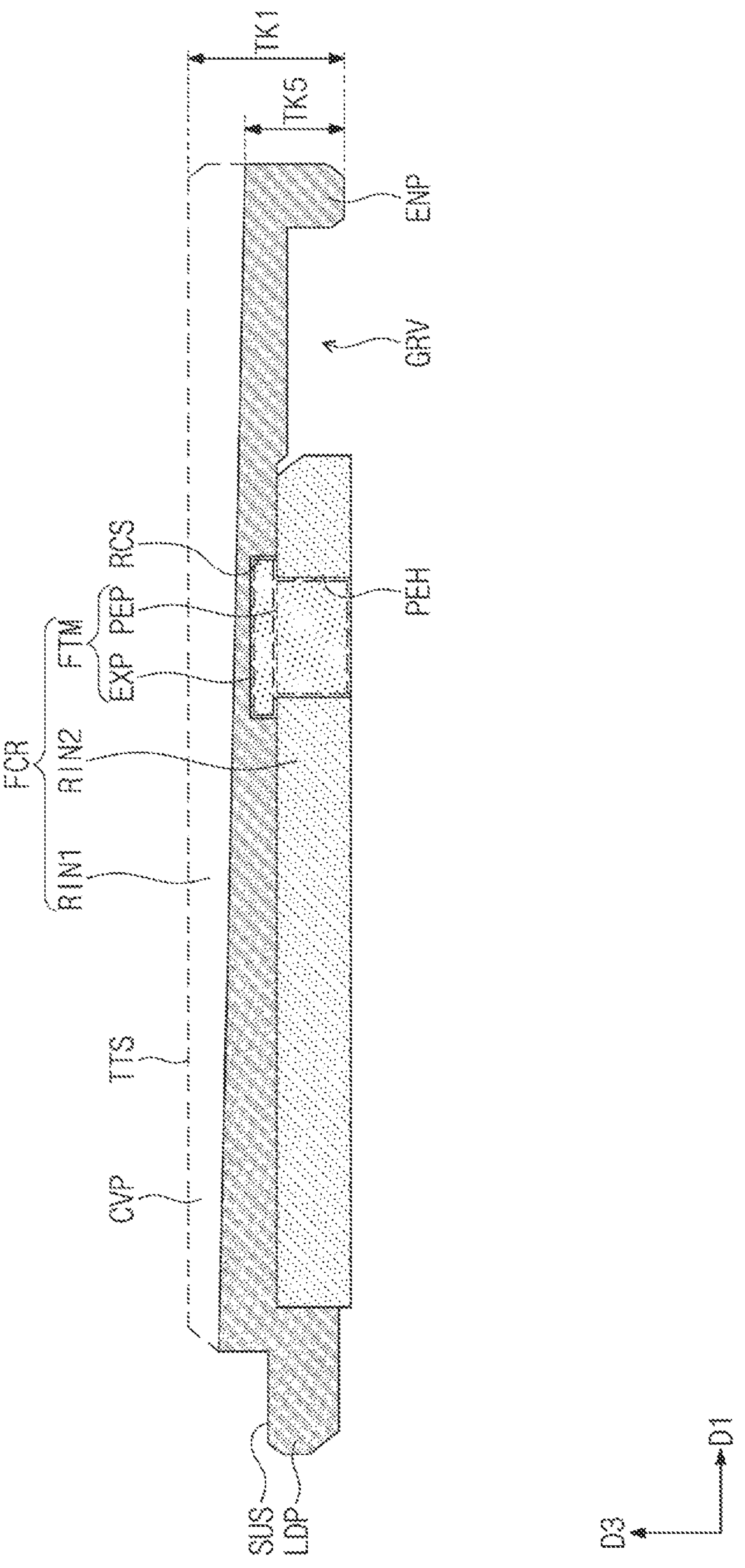
FIGS. 12 and 13 are cross-sectional views for explaining a method for replacing a first ring according to an embodiment of the inventive concept.
Figure 13:
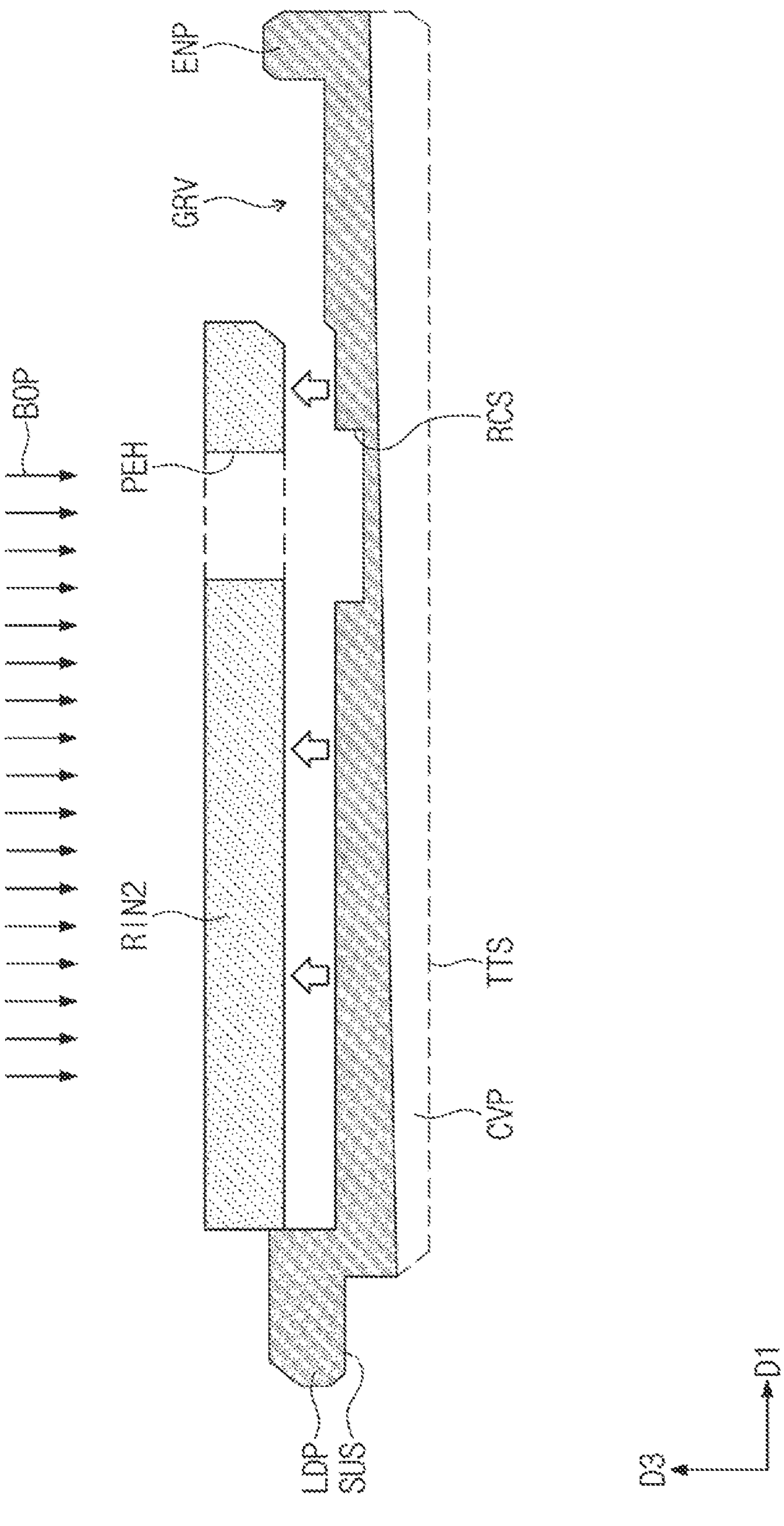

FIGS. 12 and 13 are cross-sectional views for explaining a method for replacing a first ring according to an embodiment of the inventive concept. Referring to FIG. 12, a maximum thickness of the unused focus ring FCR may be the first thickness TK1. That is, the maximum thickness of the unused first ring RIN1 may be the first thickness TK1.

As described above, when the focus ring FCR is mounted in the plasma device of FIG. 1 and is continuously exposed to plasma, the first ring RIN1 may be etched by the plasma, and thus, the top surface TTS of the cover part CVP may be gradually lowered. The cover part CVP that is closer to the loading part LDP may be less etched, and the cover part CVP that is closer to the outer part ENP may be etched more.

Due to the worn first ring RIN1, the thickness of the outer part ENP of the used focus ring FCR may have a fifth thickness TK5. The fifth thickness TK5 may be less than the first thickness TK1. When the fifth thickness TK5 is less than a predetermined thickness, the first ring RIN1 is no longer usable and has to replaced.

Referring to FIG. 13, the fastening member FTM of this embodiment may include a ceramic or organic polymer of which a temperature limit is lower than the melting point of silicon (Si). An incineration process BOP may be performed on the fastening member FTM to selectively remove the fastening member FTM. The incineration process BOP may be performed at a temperature higher than the temperature limit of the fastening member FTM. The incineration process BOP may be performed at a temperature lower than the melting point of silicon (Si).

Since the fastening member FTM is removed by be heated at a temperature lower than the melting point of silicon (Si), only the fastening member FTM may be selectively removed without damaging the second ring RIN2 made of silicon. Thus, the second ring RIN2 may be separated from the first ring RIN1 worn (or etched) by the exposure to the plasma, and the second ring RIN2 may be reused again. The separated second ring RIN2 may be reused as the above-described second ring RIN2 of FIG. 6.

According to this embodiment, the second ring RIN2 may be recycled by replacing only the worn first ring RIN1 with a new first ring RIN1 without discarding the second ring RIN2. Thus, economic efficiency of the focus ring FCR of the inventive concept may be improved.

Figure 14:
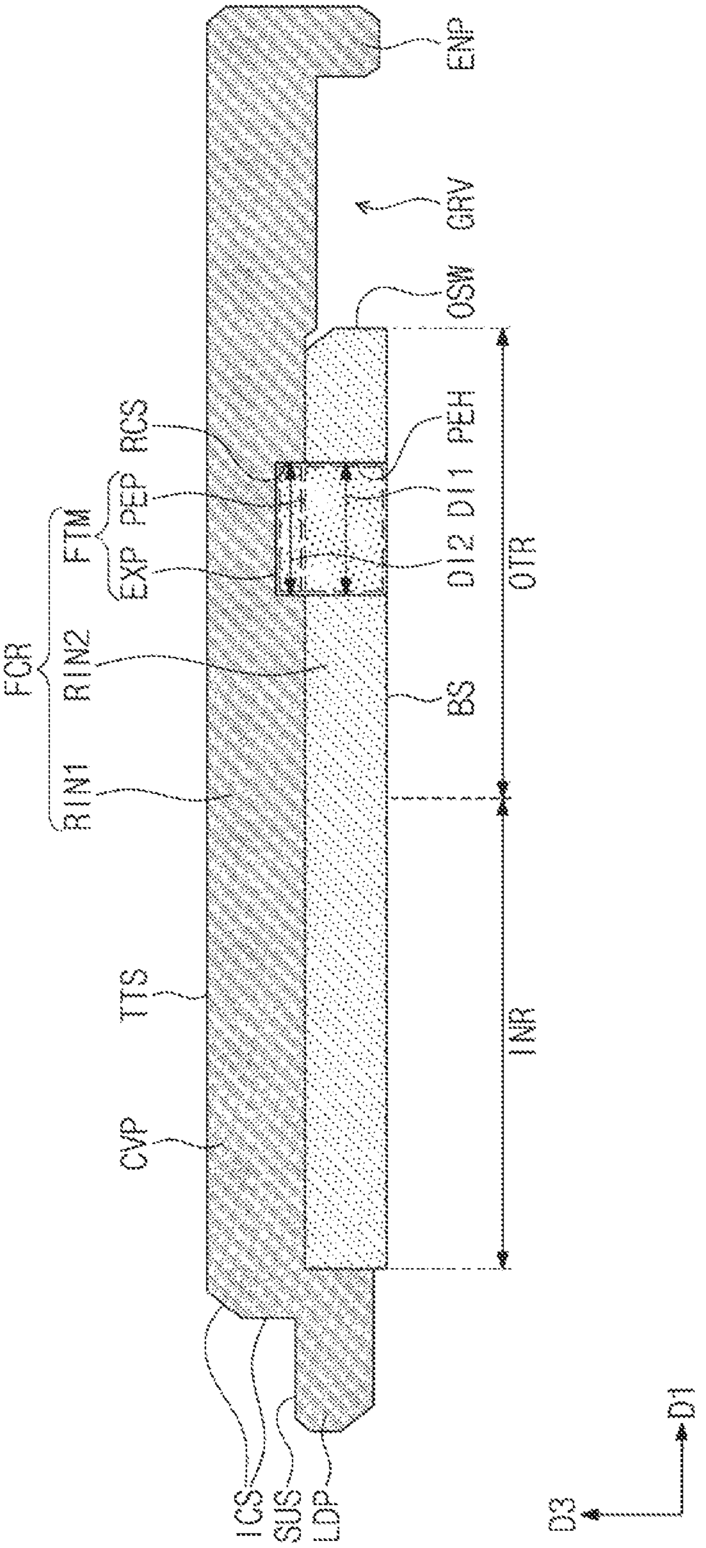
FIGS. 14, 15A, 15B, 16, and 17 are cross-sectional views taken along line A-A' of FIG. 3 so as to explain a focus ring according to another embodiment of the inventive concept.
Figure 16:
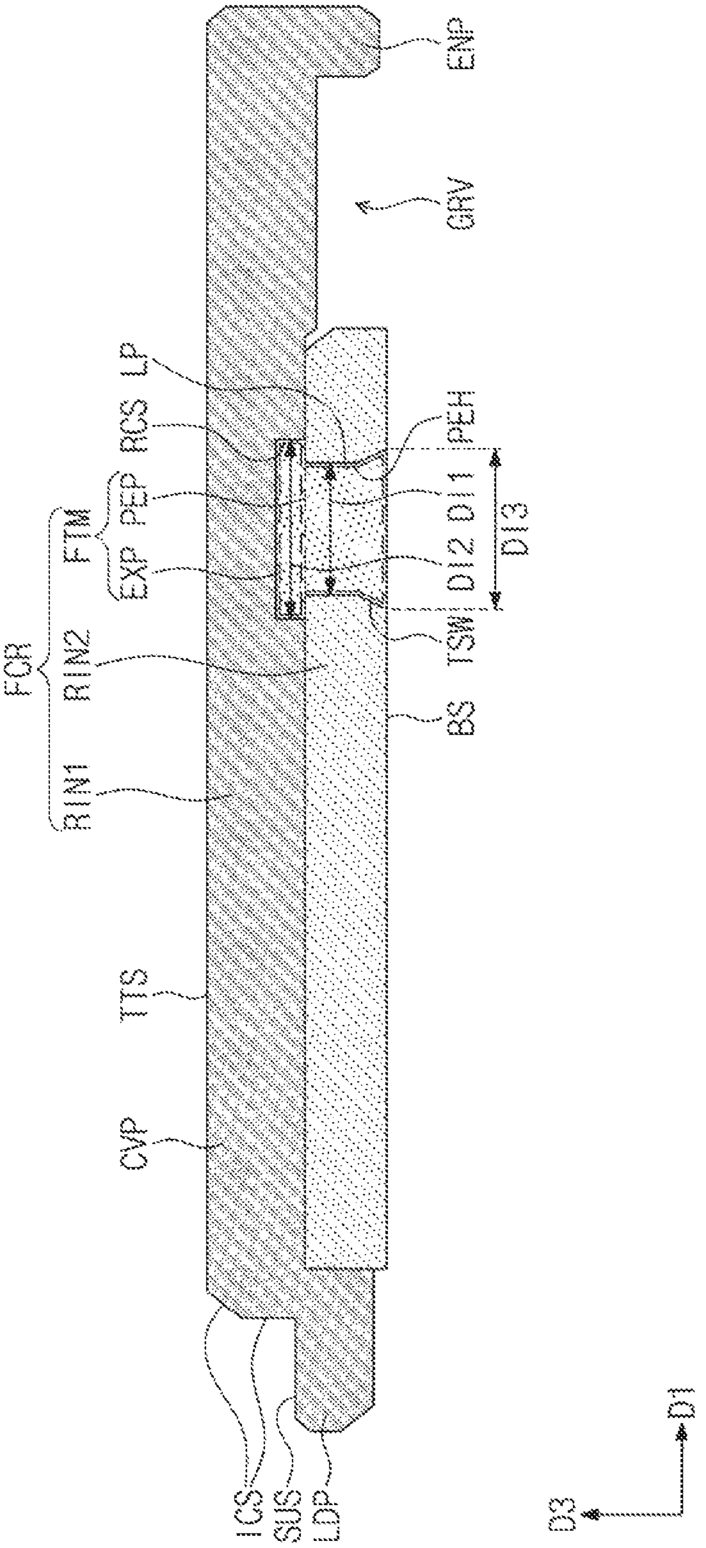
Figure 17:
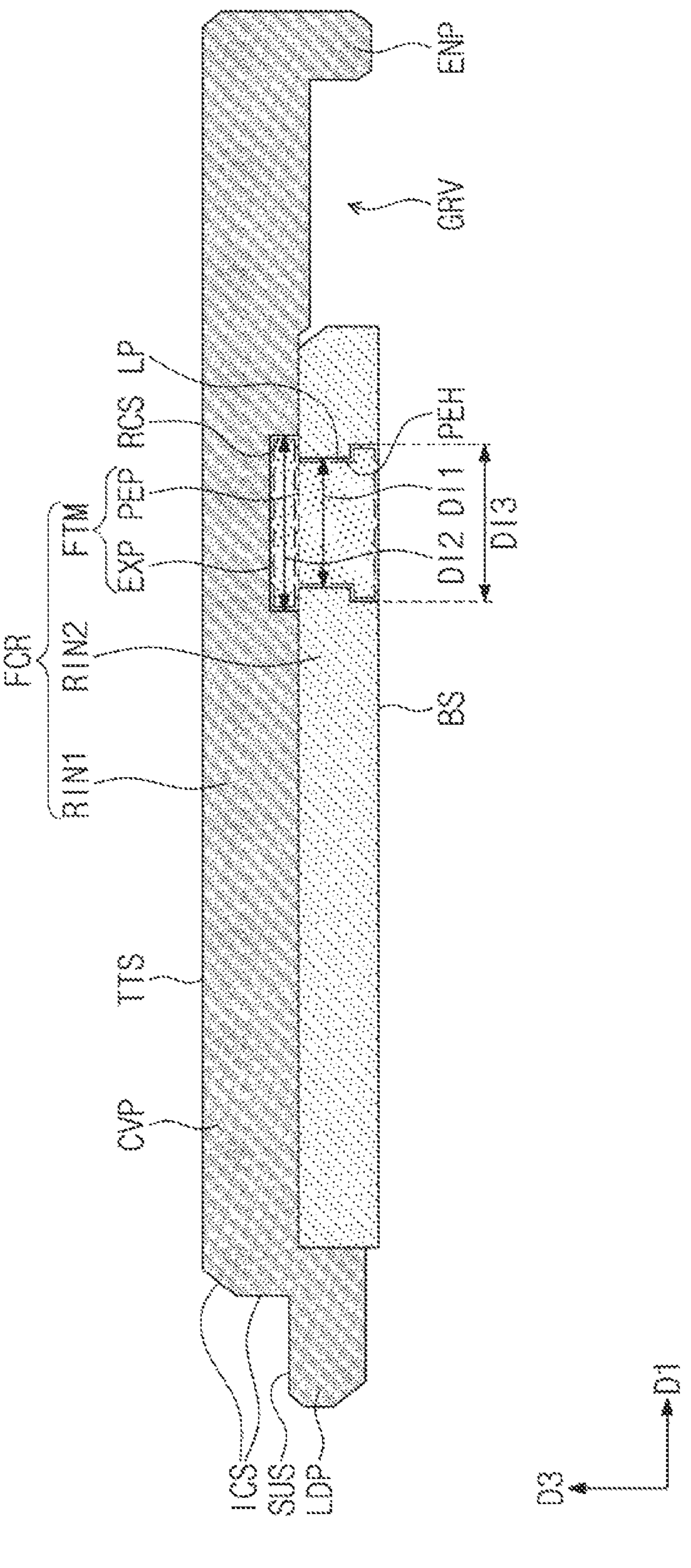

FIGS. 14, 16, and 17 are cross-sectional views taken along line A-A' of FIG. 3 so as to explain a focus ring according to another embodiment of the inventive concept. In this embodiments, detailed descriptions of technical features that are duplicated with those described with reference to FIGS. 3 and 5 will be omitted, and differences will be described in detail.

Referring to FIG. 14, the fastening member FTM may include a through-part PEP passing through the second ring RIN2 and a buried part EXP on the through-part PEP. The through-part PEP may have a first diameter DI1, and the buried part EXP may have a second diameter DI2. According to this embodiment, the second diameter DI2 may be substantially the same as the first diameter DI1. That is, the fastening member FTM may have a cylindrical shape or a rod shape.

As described above with reference to FIGS. 8 and 9, since the fastening member FTM is formed by curing the bond composition, even if the fastening member FTM does not have a bolt shape as illustrated in FIG. 4, the first and second rings RIN1 and RIN2 may be coupled to each other through the fastening member FTM.

The second ring RIN2 may include an inner region INR seated on the support plate 220 (electrostatic chuck) of FIG. 2 and an outer region OTR seated on the cover ring CVR. An outer circumferential surface OSW of the outer region OTR may be an inner surface of the groove GRV. As described above, to maintain the electrostatic force between the support plate 220 and the focus ring FCR, the fastening member FTM may be disposed within the outer region OTR. A position at which the fastening member FTM is provided may vary within the outer region OTR.

Figure 15A:
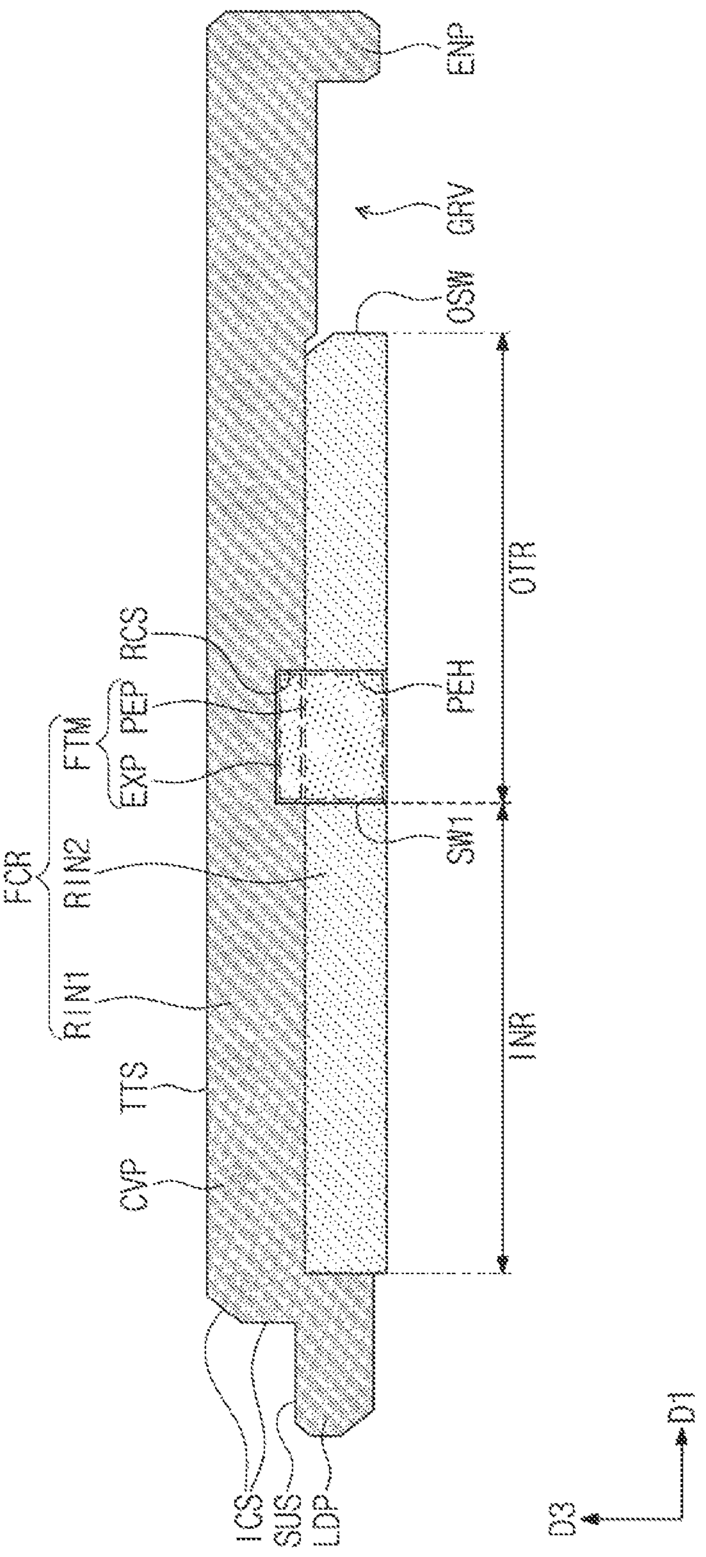
Figure 15B:
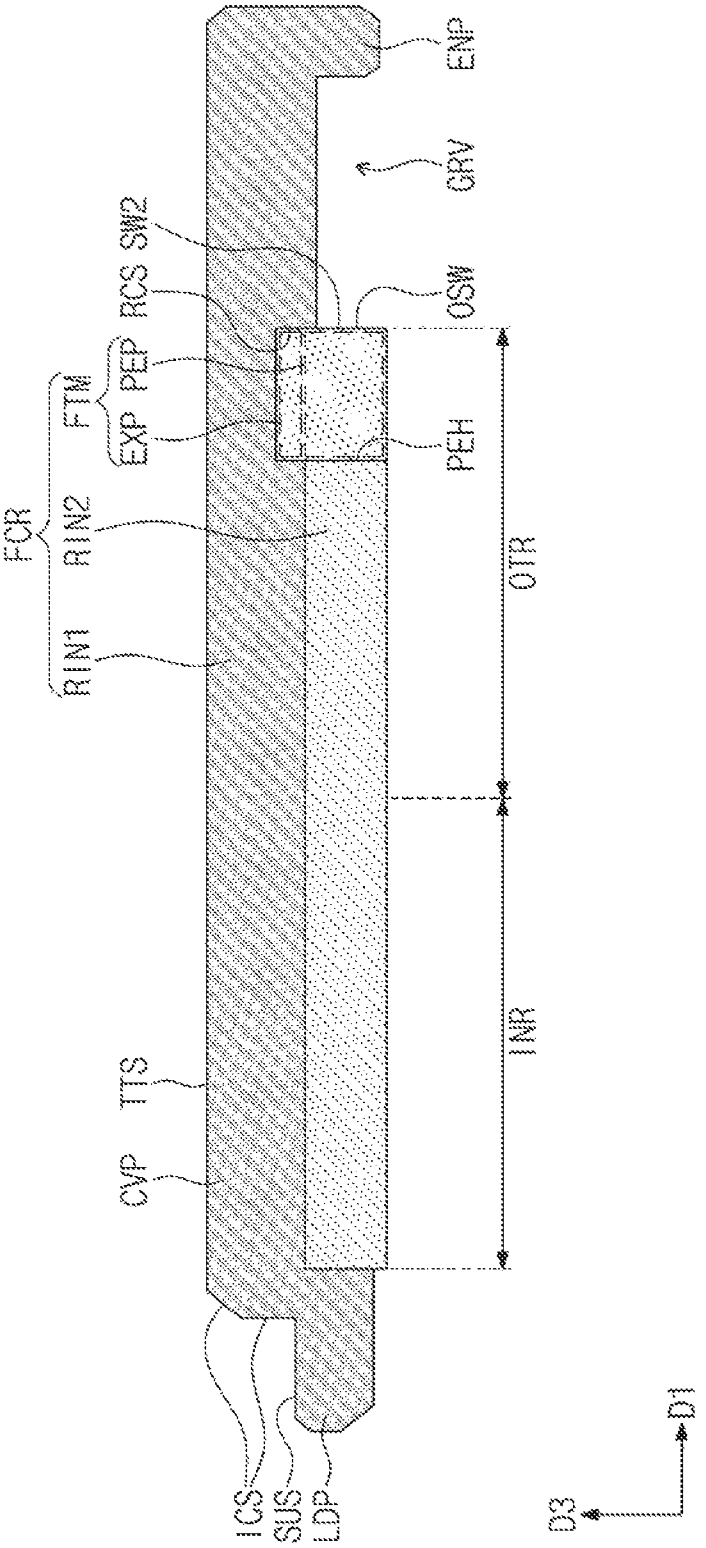

FIGS. 15A and 15B illustrate a case in which the position of the fastening member FTM of FIG. 14 is changed within the outer region OTR. For example, referring to FIG. 15A, the fastening member FTM may be disposed on a first side of the outer region OTR. A first sidewall SW1 of the fastening member FTM may be disposed at a boundary between the inner region INR and the outer region OTR. For example, referring to FIG. 15B, the fastening member FTM may be disposed on a second side of the outer region OTR. A second sidewall SW2 of the fastening member FTM may be disposed on an outer circumferential surface OSW of the outer region OTR.

Referring to FIG. 16, the through-part PEP of the fastening member FTM may include a lower portion LP exposed to the bottom surface BS of the second ring RIN2. The lower portion LP of the through-part PEP may have an inclined sidewall TSW. The lower portion LP of the through-part PEP may have a tapered shape of which a diameter increases toward the bottom surface BS of the second ring RIN2.

A maximum diameter of the lower part LP of the through-part PEP may be a third diameter DI3. The third diameter DI3 may be larger than the first diameter DI1 of the through-part PEP. The third diameter DI3 may be equal to, less than, or greater than the second diameter DI2 of the buried part EXP. The fastening member FTM may further include a tapered lower portion LP to more strongly couple the first and second rings RIN1 and RIN2 to each other.

Referring to FIG. 17, the through-part PEP of the fastening member FTM may include a lower portion LP exposed to the bottom surface BS of the second ring RIN2. The lower portion LP of the through-part PEP may have a third diameter DI3 greater than the first diameter DI1. The lower portion LP of the through-part PEP may be rapidly changed from the first diameter DI1 to the third diameter DI3. Thus, the lower part LP of the through part PEP may have a head shape of a bolt. The third diameter DI3 may be equal to, less than, or greater than the second diameter DI2 of the buried part EXP. The fastening member FTM may further include a lower part LP in the form of a bolt head to more strongly couple the first and second rings RIN1 and RIN2 to each other.

Figure 18:
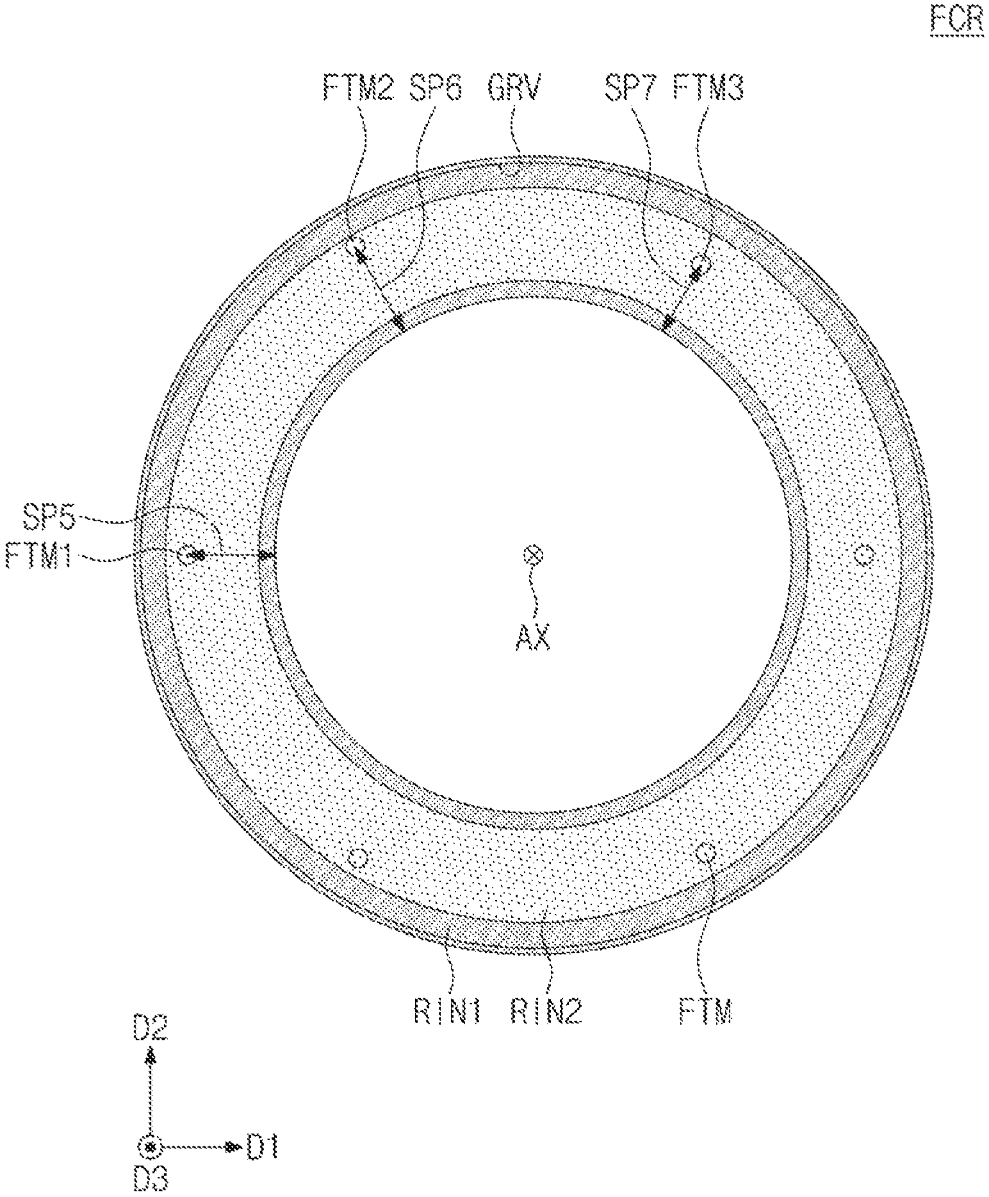
FIGS. 18 and 19 are plan views illustrating a bottom surface of a focus ring according to another embodiment of the inventive concept.
Figure 19:
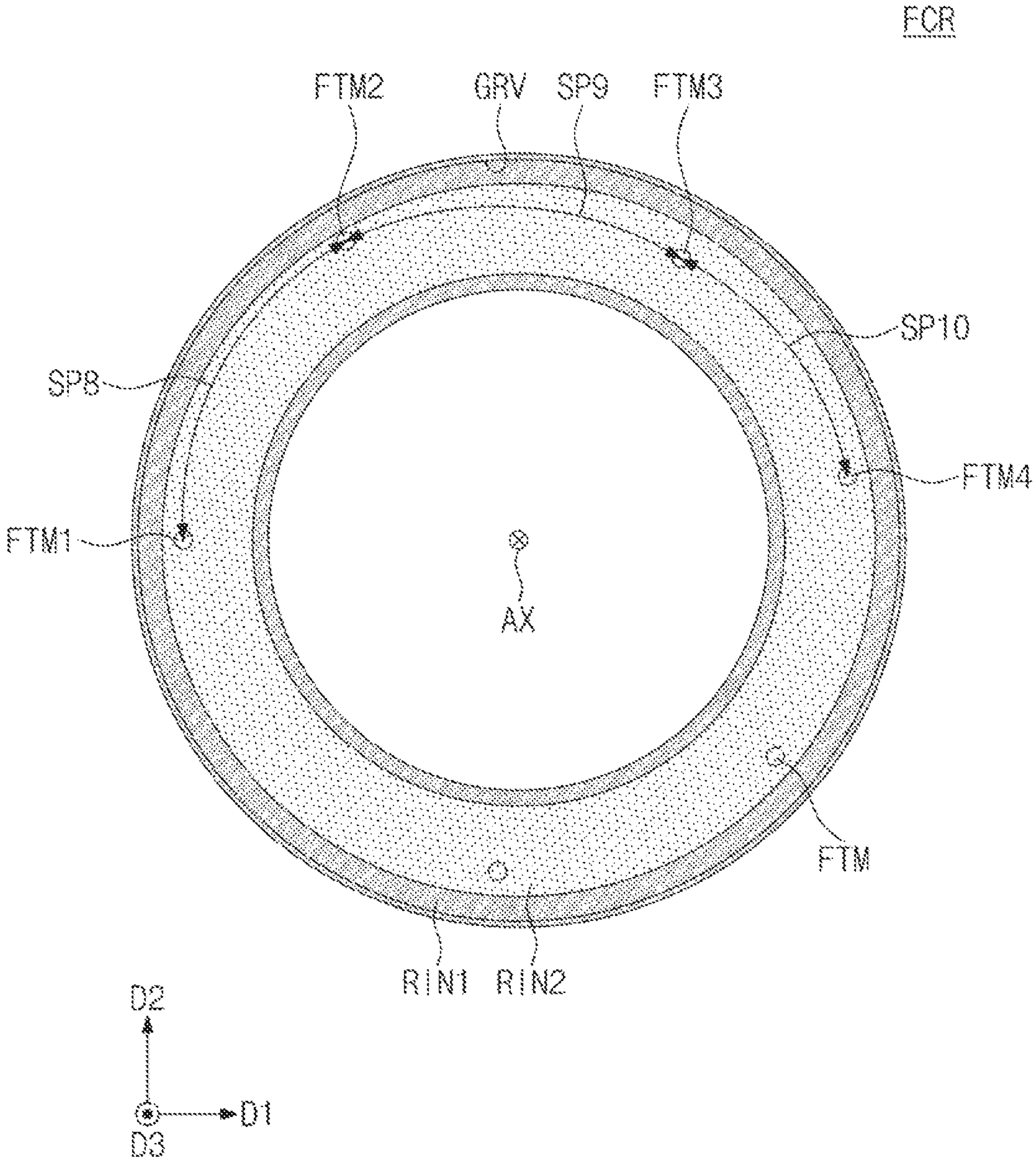

FIGS. 18 and 19 are plan views illustrating a bottom surface of a focus ring according to another embodiment of the inventive concept. In this embodiment, detailed descriptions of technical features that are duplicated with those described with reference to FIG. 10 will be omitted, and differences will be described in detail.

Referring to FIG. 18, the plurality of fastening members FTM may include first, second, and third fastening members FTM1, FTM2, and FTM3, which are sequentially arranged in the clockwise direction. A distance from an inner circumferential surface of the first ring RIN1 to a center of the first fastening member FTM1 may be a fifth distance SP5. A distance from the inner circumferential surface of the first ring RIN1 to a center of the second fastening member FTM2 may be a sixth distance SP6. A distance from the inner circumferential surface of the first ring RIN1 to a center of the third fastening member FTM3 may be a seventh distance SP7. The fifth distance SP5, the sixth distance SP6, and the seventh distance SP7 may be different from each other. That is, according to the inventive concept, the plurality of fastening members FTM may not be disposed at the same distance from the central axis AX, but may be disposed at different distances from each other. In other words, the arrangement of the plurality of fastening members FTM may be irregular.

Referring to FIG. 19, the plurality of fastening members FTM may include first to fourth fastening members FTM1 to FTM4, which are sequentially arranged in a clockwise direction. An interval between the first fastening member FTM1 and the second fastening member FTM2 may be an eighth distance SP8, an interval between the second fastening member FTM2 and the third fastening member FTM3 may be a ninth distance SP9, and an interval between the third fastening member FTM3 and the fourth fastening member FTM4 may be a tenth distance SP10. In this case, the eighth distance SP8, the ninth distance SP9, and the tenth distance SP10 may be different from each other.

According to this embodiment, the plurality of fastening members FTM may be arranged at irregular intervals. For example, in an area on which strong coupling force between the first and second rings RIN1 and RIN2 is required, the fastening members FTM may be arranged at narrow intervals.

In the focus ring according to the embodiments of the inventive concept, since the first ring having the high etch resistance instead of the second ring is exposed to the plasma, the focus ring may be improved in durability. Since the second ring is made of the material cheaper than the first ring, the focus ring may be improved in economic efficiency.

The first ring and the second ring may be firmly coupled physically and chemically by the bolt type fastening member. Since the fastening member is formed through the chemical curing method instead of the physical coupling method, the focus ring may be easily manufactured, and the first ring and the second ring may be stably coupled.

Since the fastening member is selectively removed by the incineration process, the first ring worn due to the exposure to plasma may be replaced with the new first ring. Therefore, the focus ring may be more improved in economic efficiency.

Although the embodiment of the present invention is described with reference to the accompanying drawings, those with ordinary skill in the technical field of the present invention pertains will be understood that the present invention can be carried out in other specific forms without changing the technical idea or essential features. Thus, the above-disclosed embodiments are to be considered illustrative and not restrictive.

What is claimed is:

1. A focus ring comprising:
- a first ring made of a first material;
- a second ring covered by the first ring, the second ring being made of a second material different from the first material; and
- a fastening member configured to couple the first ring to the second ring,
- wherein the fastening member comprises:
  - a through-part configured to pass through the second ring; and
  - a buried part buried in a lower portion of the first ring,
  - wherein the through-part has a first diameter,
  - wherein the buried part has a second diameter greater than or equal to the first diameter,
  - wherein the first ring comprises a cover part configured to cover the second ring,
  - wherein the cover part has a second thickness,
  - wherein the buried part has a fourth thickness, and
  - wherein a ratio of the fourth thickness to the second thickness is about 0.1 to 0.7.

2. The focus ring of claim 1, wherein the second diameter is greater than the first diameter, and
- a ratio of the second diameter to the first diameter is about 1.1 to about 2.

3. The focus ring of claim 1, wherein the fastening member includes a plurality of fastening members, and
- the plurality of fastening members are arranged at regular intervals along the second ring.

4. The focus ring of claim 3, wherein the number of plurality of fastening member is 4 to 24.

5. The focus ring of claim 1, wherein the fastening member comprises a first fastening member and a second fastening member,
- wherein a distance between an inner circumferential surface of the first ring and a center of the first fastening member is a first distance, and
- a distance between the inner circumferential surface of the first ring and a center of the second fastening member is a second distance,
- wherein the first distance and the second distance are different from each other.

6. The focus ring of claim 1, wherein the fastening member comprises a first fastening member, a second fastening member, and a third fastening member, which are sequentially arranged in a clockwise direction,
- wherein an interval between the first fastening member and the second fastening member is a first distance, and
- an interval between the second fastening member and the third fastening member is a second distance,
- wherein the first distance and the second distance are different from each other.

7. The focus ring of claim 1, wherein a first center line passing through a center of the first ring is defined, and
- the fastening member is disposed outside the first center line.

8. The focus ring of claim 1, wherein the second ring comprises an inner region seated on an electrostatic chuck, and an outer region seated on a cover ring, and
- the fastening member is disposed within the outer region.

9. The focus ring of claim 1, wherein the first material and the second material are selected from different materials from the group consisting of silicon carbide (SiC), silicon (Si), and boron carbide.

10. The focus ring of claim 1, wherein the fastening member comprises:
- at least one ceramic material selected from the group consisting of zirconium oxide, zirconium silicon oxide, aluminum oxide, yttrium oxide, magnesium oxide, silicon carbide, and aluminum nitride; or
- an organic polymer.

11. The focus ring of claim 1, wherein the fastening member has a recessed bottom surface.

12. The focus ring of claim 11, wherein the recessed bottom surface comprises a lowest surface at an edge thereof and a highest surface at a center thereof, and
- the lowest surface is disposed at the same level as or higher than the bottom surface of the second ring.

13. The focus ring of claim 1, wherein a lower portion of the through-part has a third diameter greater than the first diameter.

14. The focus ring of claim 13, wherein the lower portion of the through-part has a tapered shape of which a diameter gradually increases.

15. The focus ring of claim 1, wherein the second ring includes a through-hole passing therethrough, wherein the first ring includes a circular recess at a lower portion thereof, wherein the through-part is provided in the through-hole, and wherein the buried part is provided in the circular recess.

* * * * *